United States Patent
Yosui et al.

(10) Patent No.: US 9,538,638 B2
(45) Date of Patent: Jan. 3, 2017

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 104 days.

(21) Appl. No.: 14/520,504

(22) Filed: Oct. 22, 2014

(65) Prior Publication Data
US 2015/0036303 A1 Feb. 5, 2015

Related U.S. Application Data

(63) Continuation of application No. PCT/JP2013/074649, filed on Sep. 12, 2013.

(30) Foreign Application Priority Data

Oct. 12, 2012 (JP) .................................. 2012-226568
Feb. 19, 2013 (JP) .................................. 2013-030024

(51) Int. Cl.
*H01P 3/08* (2006.01)
*H05K 1/02* (2006.01)
(Continued)

(52) U.S. Cl.
CPC ................. *H05K 1/025* (2013.01); *H01P 3/08* (2013.01); *H01P 3/085* (2013.01); *H05K 1/0221* (2013.01);
(Continued)

(58) Field of Classification Search
CPC ............. H01P 3/08; H01P 3/081; H01P 3/082; H01P 3/084; H01P 3/085; H01P 3/087
(Continued)

(56) References Cited

U.S. PATENT DOCUMENTS 4,855,537 A * 8/1989 Nakai .................. H05K 1/0253
174/250
2012/0097433 A1 4/2012 Kato et al.
(Continued)

FOREIGN PATENT DOCUMENTS

JP 2007-123740 A 5/2007
WO 2011/007660 A1 1/2011
(Continued)

OTHER PUBLICATIONS

Official Communication issued in International Patent Application No. PCT/JP2013/074649, mailed on Dec. 17, 2013.

*Primary Examiner* — Stephen E Jones
(74) *Attorney, Agent, or Firm* — Keating & Bennett, LLP

(57) ABSTRACT

A high-frequency signal transmission line includes a dielectric element assembly including a plurality of dielectric layers laminated on each other, a linear signal line provided at the dielectric element assembly, and a first ground conductor provided on a first side in a direction of lamination relative to the signal line and including a plurality of openings arranged along the signal line. The dielectric layer positioned at an end of the first side in the direction of lamination includes an undulating portion provided on a first principal surface located on the first side in the direction of lamination, such that the undulating portion overlaps with the openings when viewed in a plan view in the direction of lamination.

20 Claims, 28 Drawing Sheets

(51) Int. Cl.
   *H05K 1/11* (2006.01)
   *H05K 1/14* (2006.01)
(52) U.S. Cl.
   CPC .............. *H05K 1/115* (2013.01); *H05K 1/148* (2013.01); *H05K 1/0225* (2013.01); *H05K 1/0298* (2013.01); *H05K 1/147* (2013.01); *H05K 2201/0382* (2013.01)
(58) Field of Classification Search
   USPC .......................................... 333/238, 246, 33
   See application file for complete search history.

(56) References Cited

U.S. PATENT DOCUMENTS

| | | |
|---|---|---|
| 2012/0274423 A1 | 11/2012 | Kato |
| 2013/0127560 A1 | 5/2013 | Kato et al. |
| 2014/0176265 A1 | 6/2014 | Kato et al. |

FOREIGN PATENT DOCUMENTS

| | | |
|---|---|---|
| WO | 2012/074100 A1 | 6/2012 |
| WO | 2012/074101 A1 | 6/2012 |
| WO | 2013/103075 A1 | 7/2013 |

\* cited by examiner

F I G. 5
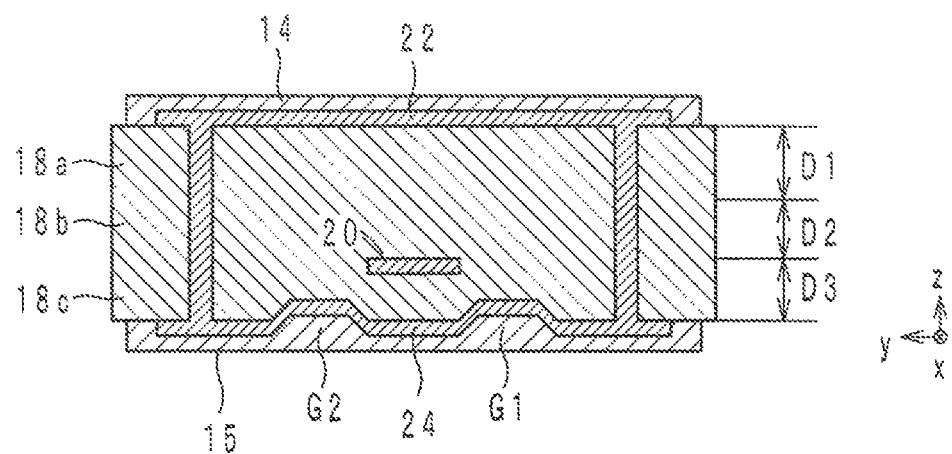
F I G. 6
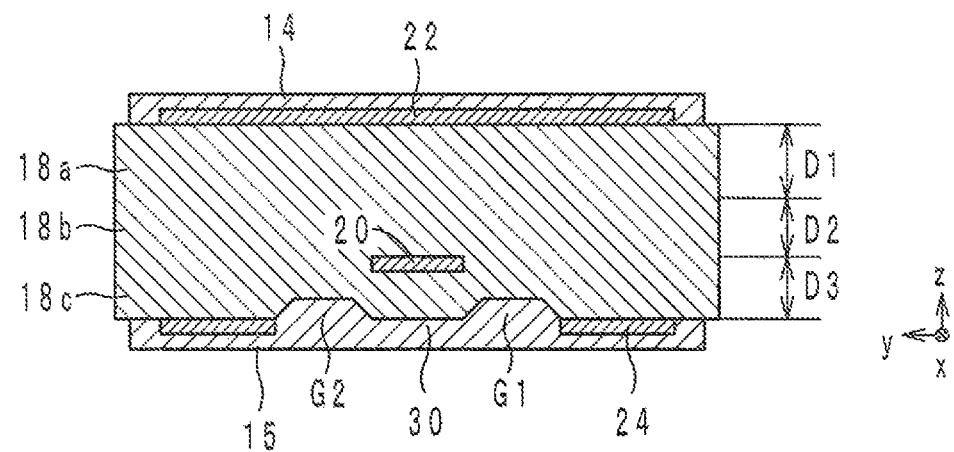

F I G . 7
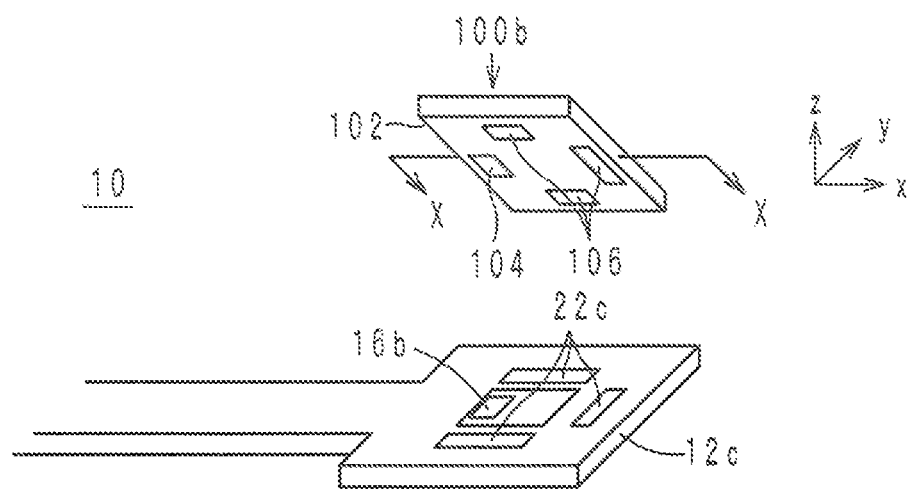
F I G . 8
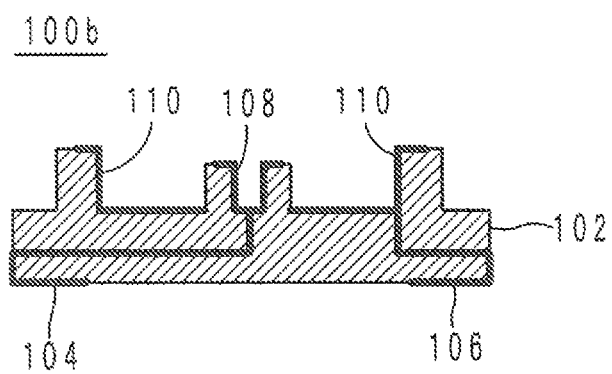

F I G . 1 3
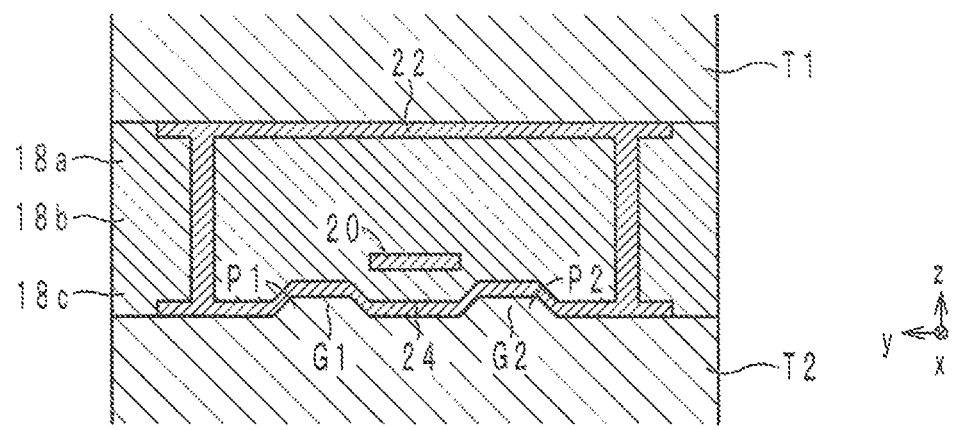
F I G . 1 4
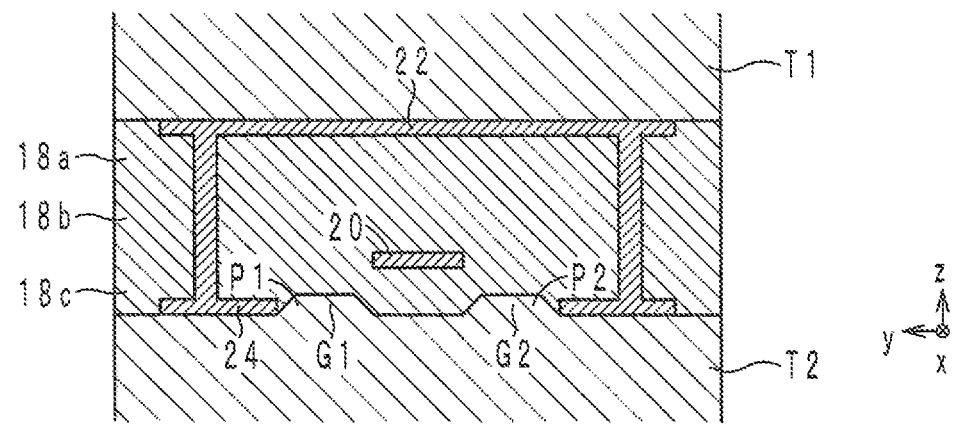

F I G . 1 8
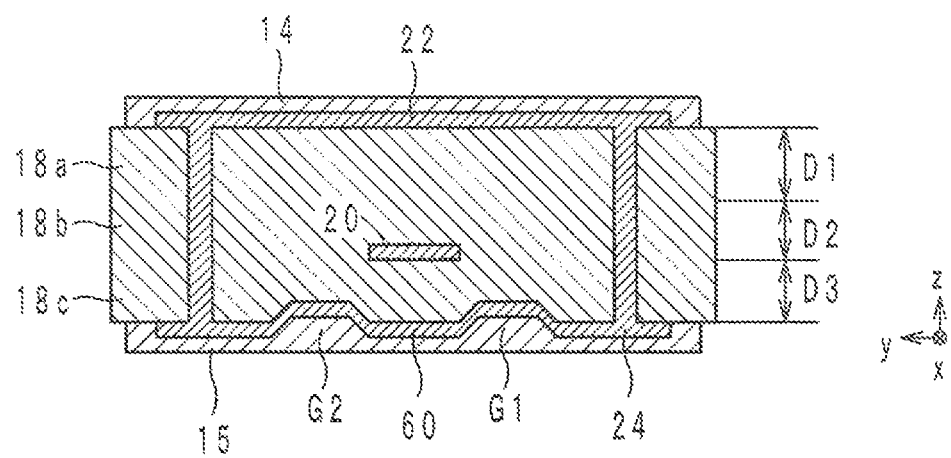
F I G . 1 9
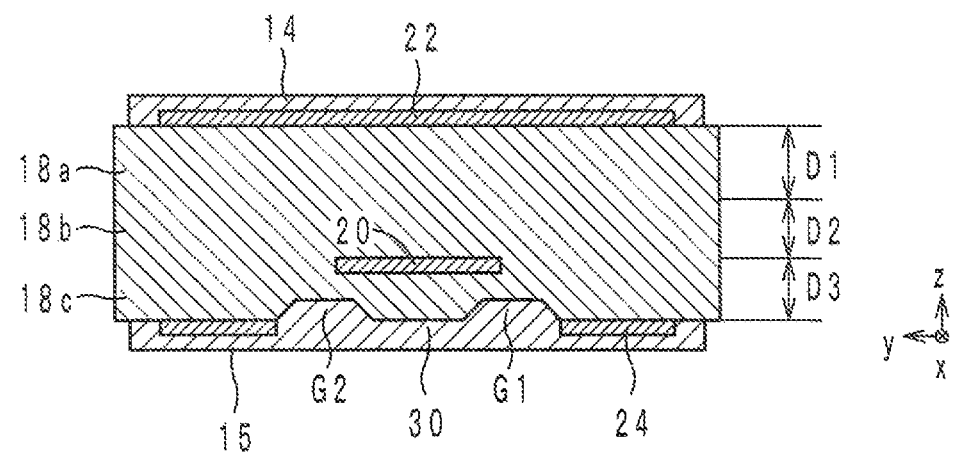

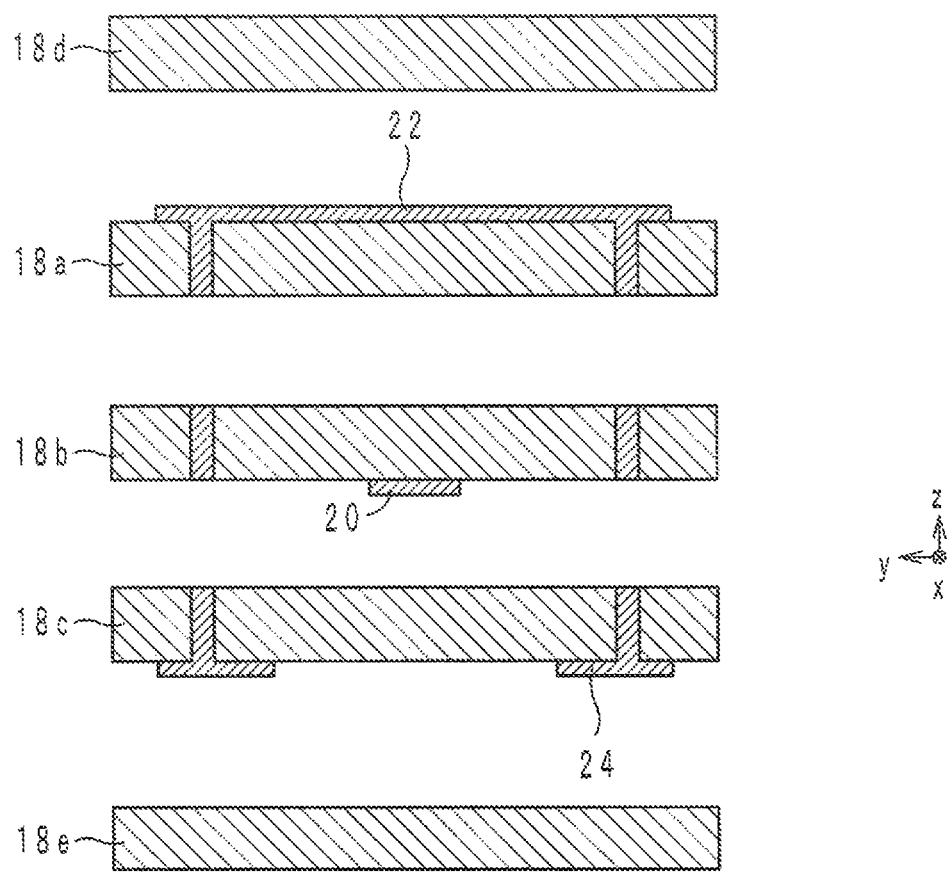
F I G . 3 0

F I G. 31
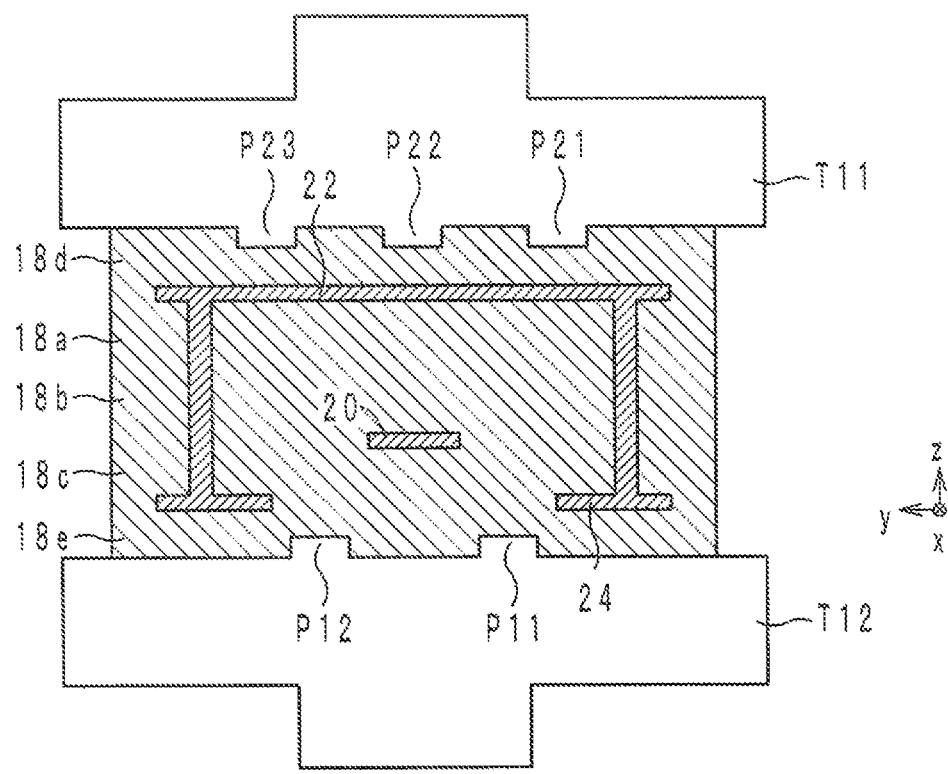

F I G . 3 6
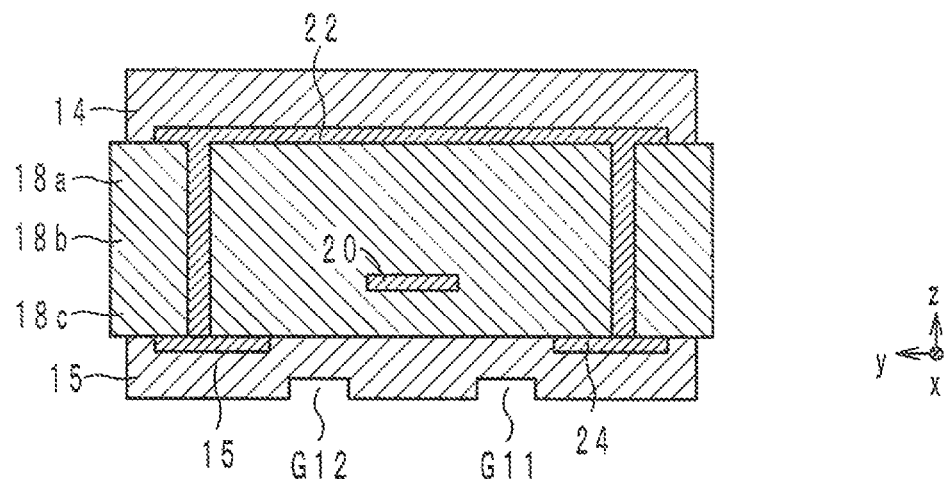

HIGH-FREQUENCY SIGNAL TRANSMISSION LINE AND ELECTRONIC DEVICE

This application is based on Japanese Patent Application No. 2013-030024 filed on Feb. 19, 2013, Japanese Patent Application No. 2012-226568 filed on Oct. 12, 2012, and International Application No. PCT/JP2013/074649 filed on Sep. 12, 2013, the entire contents of each of which is incorporated herein by reference.

BACKGROUND OF THE INVENTION

1. Field of the Invention

The present invention relates to high-frequency signal transmission lines and electronic devices, and more particularly, the present invention relates to a high-frequency signal transmission line for use in high-frequency signal transmission and an electronic device including the same.

2. Description of the Related Art

As an invention relevant to a conventional high-frequency signal transmission line, a high-frequency signal line described in, for example, International Publication WO 2012/074100 is known. FIG. 37 is a cross-sectional structure view of the high-frequency signal line 500 described in International Publication WO 2012/074100.

The high-frequency signal line 500 includes a dielectric element assembly 512, a high-permittivity layer 515, a signal line 520, and ground conductors 522 and 524. The dielectric element assembly 512 is formed by laminating a plurality of dielectric sheets. The signal line 520 is provided in the dielectric element assembly 512. The ground conductor 522 is positioned on the positive side in the z-axis direction relative to the signal line 520. The ground conductor 524 is positioned on the negative side in the z-axis direction relative to the signal line 520. The ground conductor 524 has openings 530 provided therein. The high-permittivity layer 515 is positioned on the principal surface of the dielectric element assembly 512 that is located on the negative side in the z-axis direction. The high-permittivity layer 515 has a higher specific permittivity than the dielectric element assembly 512.

In the high-frequency signal line 500 thus configured, the high-permittivity layer 515 covers the openings 530. Accordingly, more electromagnetic field radiation from the signal line 520 is reflected into the high-frequency signal line 500 at the interface between the high-permittivity layer 515 and the air space, resulting in reduced spurious radiation.

Incidentally, in the case of the high-frequency signal line 500, if the specific permittivity of the high-permittivity layer 515 is increased, the characteristic impedance of the high-frequency signal line 500 might deviate from a desired impedance value (e.g., 50Ω). More specifically, from the viewpoint of reducing spurious radiation, the high-permittivity layer 515 preferably has a high specific permittivity. However, in the case where the specific permittivity of the high-permittivity layer 515 is high, if there is a metallic body or the like near the opening 530, high capacitance is generated between the signal line 520 and the metallic body or the like. As a result, the characteristic impedance of the high-frequency signal line 500 becomes lower than the desired impedance value.

SUMMARY OF THE INVENTION

A high-frequency signal transmission line according to a preferred embodiment of the present invention includes a dielectric element assembly including a plurality of dielectric layers laminated on each other, a linear signal line provided at the dielectric element assembly, and a first ground conductor provided on a first side in a direction of lamination relative to the signal line and including a plurality of openings arranged along the signal line. The dielectric layer positioned at a end of the first side in the direction of lamination includes an undulating portion provided on a first principal surface located on the first side in the direction of lamination, such that the undulating portion overlaps with the openings when viewed in a plan view in the direction of lamination.

An electronic device according to another preferred embodiment of the present invention includes a high-frequency signal transmission line, and a housing accommodating the high-frequency signal transmission line. The high-frequency signal transmission line includes a dielectric element assembly including a plurality of dielectric layers laminated on each other, a linear signal line provided in the dielectric element assembly, and a first ground conductor provided on a first side in a direction of lamination relative to the signal line and including a plurality of openings arranged along the signal line. The dielectric layer positioned at a end of the first side in the direction of lamination includes an undulating portion provided on a first principal surface located on the first side in the direction of lamination, such that the undulating portion overlaps with the openings when viewed in a plan view in the direction of lamination.

A high-frequency signal transmission line according to still another preferred embodiment of the present invention includes a dielectric element assembly including a plurality of dielectric layers laminated on each other, a linear signal line provided in the dielectric element assembly, and a first ground conductor provided on a first side in a direction of lamination relative to the signal line and including a plurality of openings arranged along the signal line. The dielectric element assembly includes an undulating portion provided on a first principal surface located on the first side in the direction of lamination, so as to overlap with the openings when viewed in a plan view in the direction of lamination.

An electronic device according to yet another preferred embodiment of the present invention includes a high-frequency signal transmission line, and a housing accommodating the high-frequency signal transmission line. The high-frequency signal transmission line includes a dielectric element assembly including a plurality of dielectric layers laminated on each other, a linear signal line provided in the dielectric element assembly, and a first ground conductor provided on a first side in a direction of lamination relative to the signal line and including a plurality of openings arranged along the signal line. The dielectric element assembly includes an undulating portion provided on a first principal surface located on the first side in the direction of lamination, so as to overlap with the openings when viewed in a plan view in the direction of lamination.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a cross-sectional structure view taken along line A-A of FIG. 3.

FIG. 6 is a cross-sectional structure view taken along line B-B of FIG. 3.

FIG. 7 is an external oblique view of a connector of the high-frequency signal transmission line.

FIG. 8 is a cross-sectional structure view of the connector of the high-frequency signal transmission line.

FIG. 13 is another cross-sectional view for the process of pressure bonding of the high-frequency signal transmission line.

FIG. 14 is another cross-sectional view for the process of pressure bonding of the high-frequency signal transmission line.

FIG. 18 is a cross-sectional structure view of the line portion taken at a bridge portion.

FIG. 19 is a cross-sectional structure view of the line portion taken at an opening.

FIG. 30 is a cross-sectional view for the process of pressure bonding of the high-frequency signal transmission line.

FIG. 31 is another cross-sectional view for the process of pressure bonding of the high-frequency signal transmission line.

FIG. 36 is a cross-sectional structure view of a high-frequency signal transmission line according to a sixth modification of a preferred embodiment of the present invention.

FIG. 37 is a cross-sectional structure view of a high-frequency signal transmission line described in International Publication WO 2012/074100.

DETAILED DESCRIPTION OF THE PREFERRED EMBODIMENTS

Hereinafter, high-frequency signal transmission lines according to preferred embodiments of the present invention, along with an electronic device, will be described with reference to the drawings.

Figure 1:
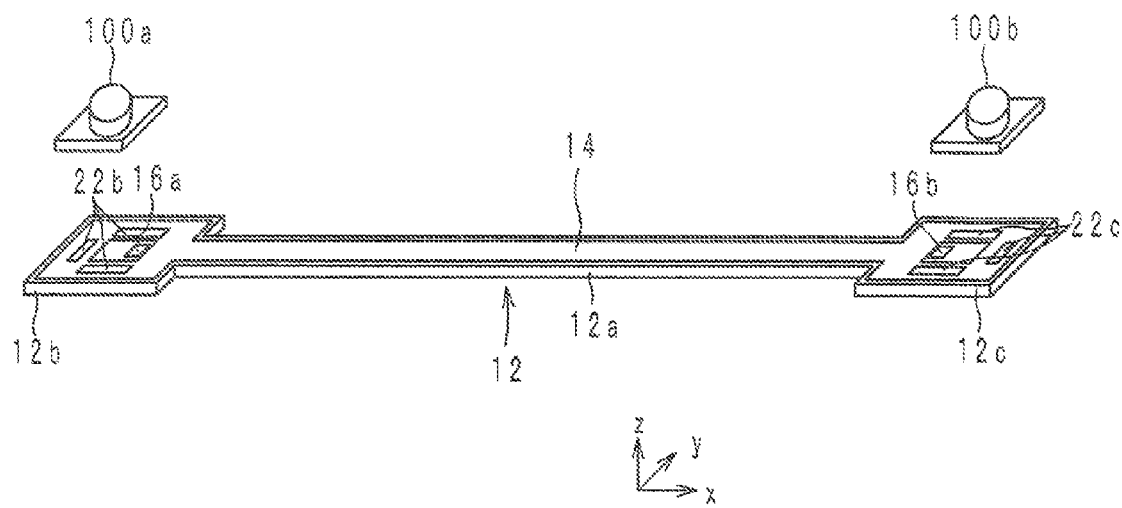
FIG. 1 is an external oblique view of a high-frequency signal transmission line according to a preferred embodiment of the present invention.
Figure 2:
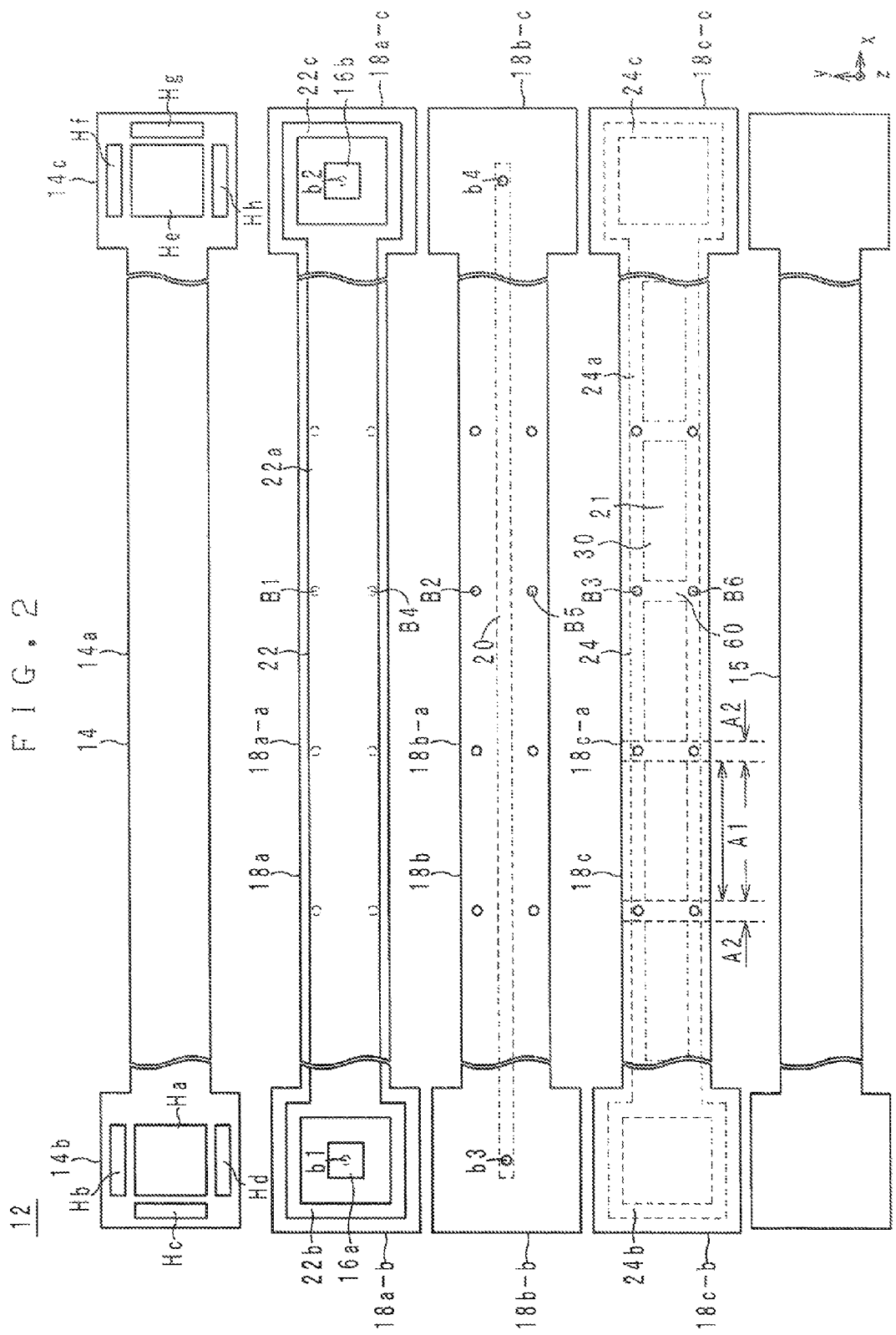
FIG. 2 is an exploded view of a laminate of the high-frequency signal transmission line in FIG. 1.
Figure 3:
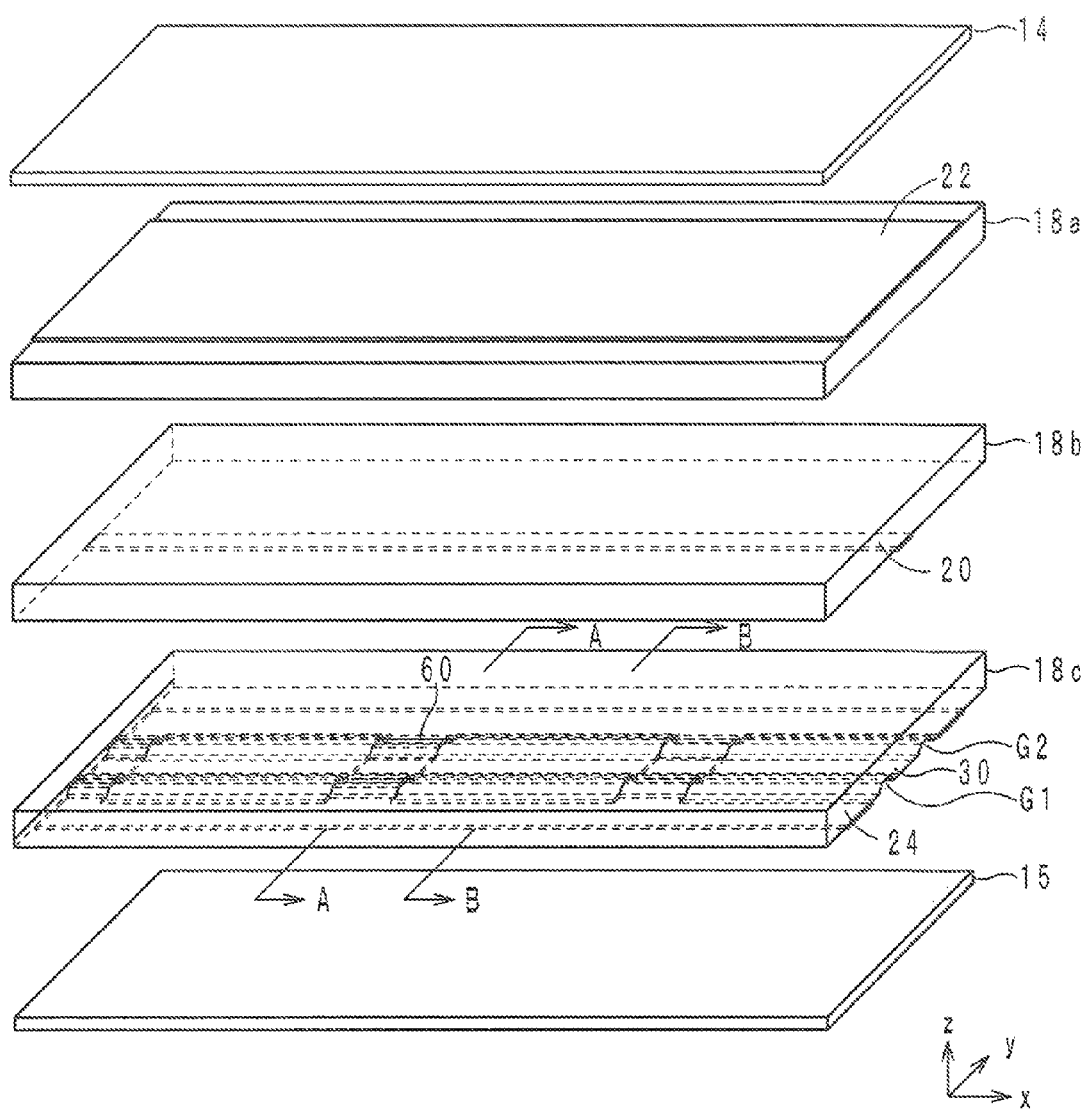
FIG. 3 is an oblique exploded view of a line portion of the high-frequency signal transmission line.
Figure 4:
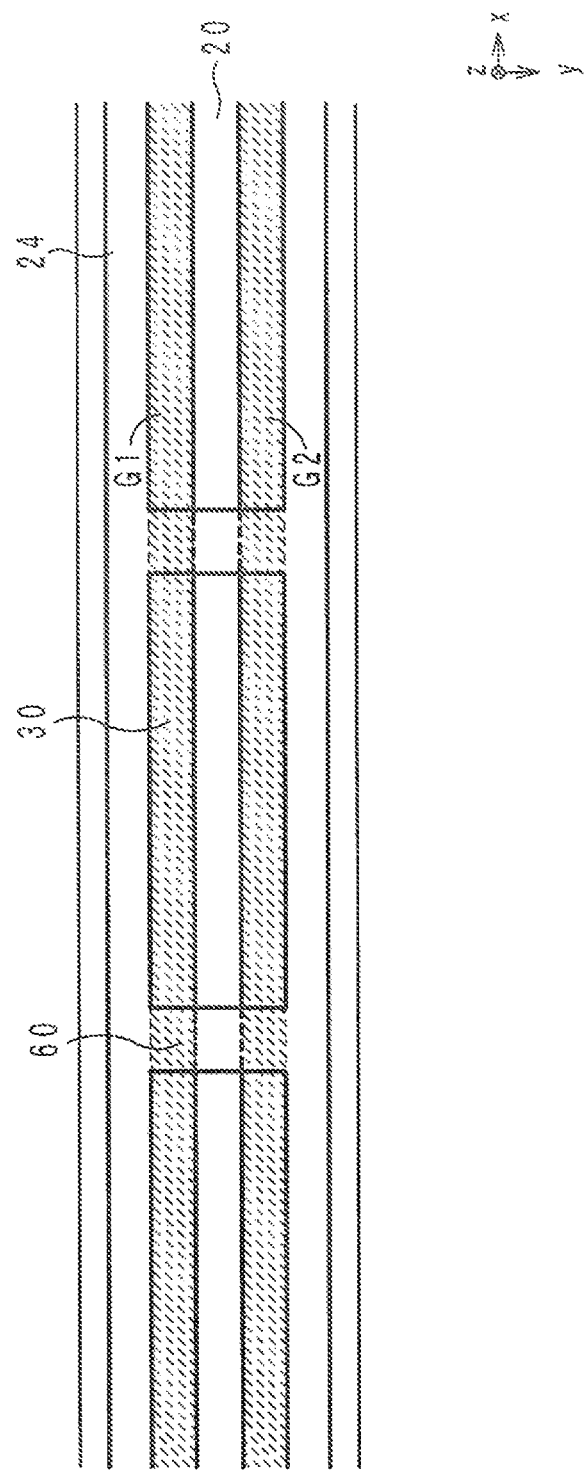
FIG. 4 is a plan view of the line portion of the high-frequency signal transmission line.

The configuration of the high-frequency signal transmission line according to a preferred embodiment will be described below with reference to the drawings. FIG. 1 is an external oblique view of the high-frequency signal transmission line 10 according to the present preferred embodiment. FIG. 2 is an exploded view of a dielectric element assembly 12 of the high-frequency signal transmission line 10 in FIG. 1. FIG. 3 is an oblique exploded view of a line portion 12a of the high-frequency signal transmission line 10. FIG. 4 is a plan view of the line portion 12a of the high-frequency signal transmission line 10. FIG. 5 is a cross-sectional structure view taken along line A-A of FIG. 3. FIG. 6 is a cross-sectional structure view taken along line B-B of FIG. 3. In the following, the direction of lamination of the high-frequency signal transmission line 10 will be defined as a z-axis direction. Moreover, the longitudinal direction of the high-frequency signal transmission line 10 will be defined as an x-axis direction, and the direction perpendicular to the x-axis and z-axis directions will be defined as a y-axis direction.

The high-frequency signal transmission line 10 is preferably used in, for example, an electronic device such as a cell phone to connect two high-frequency circuits. The high-frequency signal transmission line 10 includes the dielectric element assembly 12, external terminals 16a and 16b, a signal line 20, a reference ground conductor 22, an auxiliary ground conductor 24, via-hole conductors b1 to b4 and B1 to B6, and connectors 100a and 100b, as shown in FIGS. 1 through 3.

The dielectric element assembly 12 is a flexible plate-shaped member extending in the x-axis direction when viewed in a plan view in the z-axis direction, and includes the line portion 12a and connecting portions 12b and 12c, as shown in FIG. 1. The dielectric element assembly 12 is a laminate including a protective layer 14, dielectric sheets 18a to 18c, and a protective layer 15 laminated in this order, from the positive side to the negative side in the z-axis direction, as shown in FIG. 2. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The line portion 12a extends in the x-axis direction, as shown in FIG. 1. The connecting portions 12b and 12c are preferably in the shape of rectangles connected to the ends of the line portion 12a respectively on the negative and positive sides in the x-axis direction. The width of each of the connecting portions 12b and 12c in the y-axis direction is greater than the width of the line portion 12a in the y-axis direction.

The dielectric sheets 18a to 18c, when viewed in a plan view in the z-axis direction, extend in the x-axis direction and have the same shape as the dielectric element assembly 12, as shown in FIG. 2. The dielectric sheets 18a to 18c are preferably made of a flexible thermoplastic resin such as polyimide or liquid crystal polymer. In the following, the principal surfaces of the dielectric sheets 18a to 18c that are located on the positive side in the z-axis direction will be referred to as top surfaces, and the principal surfaces of the dielectric sheets 18a to 18c that are located on the negative side in the z-axis direction will be referred to as bottom surfaces.

The total of the thickness D1 of the dielectric sheet 18a and the thickness D2 of the dielectric sheet 18b is greater than the thickness D3 of the dielectric sheet 18c, as shown in FIGS. 5 and 6. After lamination of the dielectric sheets 18a to 18c, the total of the thickness D1 and the thickness D2 preferably is, for example, from about 50 µm to about 300 µm. In the present preferred embodiment, the total of the thickness D1 and the thickness D2 preferably is about 150 µm, for example. Moreover, the thickness D1 preferably is about 75 µm, for example. The thickness D2 preferably is also about 75 µm, for example. Furthermore, the thickness D3 preferably is, for example, about 10 µm to about 100 µm. In the present preferred embodiment, the thickness D3 preferably is about 50 µm, for example.

Furthermore, the dielectric sheet 18a includes a line portion 18a-a and connecting portions 18a-b and 18a-c, as shown in FIG. 2. The dielectric sheet 18b includes a line portion 18b-a and connecting portions 18b-b and 18b-c, as shown in FIG. 2. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The signal line 20 is a conductor provided in the dielectric element assembly 12 for the purpose of high-frequency signal transmission, as shown in FIGS. 2, 3, 5, and 6. In the present preferred embodiment, the signal line 20 is a linear conductor provided on the bottom surface of the dielectric sheet 18b and extending in the x-axis direction. The end of the signal line 20 that is located on the negative side in the x-axis direction is positioned at the center of the connecting portion 18b-b, as shown in FIG. 2. The end of the signal line 20 that is located on the positive side in the x-axis direction is positioned at the center of the connecting portion 18b-c, as shown in FIG. 2. The signal line 20 is preferably made of a metal material including silver or copper and having a low specific resistance. Here, the signal line 20 is provided on the bottom surface of the dielectric sheet 18b preferably by patterning metal foil formed by plating the bottom surface of the dielectric sheet 18b or by patterning metal foil attached to the bottom surface of the dielectric sheet 18b. Moreover, the top surface of the signal line 20 is smoothened, so that surface roughness of the signal conductor 20 is greater on the side that contacts the dielectric sheet 18b than on the side that does not contact the dielectric sheet 18b.

The reference ground conductor (second ground conductor) 22 is a solid conductor layer provided on the positive side in the z-axis direction relative to the signal line 20, as shown in FIGS. 2, 3, 5, and 6. More specifically, the reference ground conductor 22 is arranged on the top surface of the dielectric sheet 18a so as to be opposite to the signal line 20 with the dielectric sheets 18a and 18b positioned therebetween. The reference ground conductor 22 has no openings overlapping with the signal line 20. The reference ground conductor 22 is preferably made of a metal material including silver or copper and having a low specific resistance. Here, the reference ground conductor 22 is provided on the top surface of the dielectric sheet 18a preferably by patterning metal foil formed by plating the top surface of the dielectric sheet 18a or by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a main conductor 22a and terminal conductors 22b and 22c, as shown in FIG. 2. The main conductor 22a is provided on the top surface of the line portion 18a-a, and extends in the x-axis direction. The terminal conductor 22b preferably has a rectangular or substantially rectangular frame shape on the top surface of the line portion 18a-b. The terminal conductor 22b is connected to the end of the main conductor 22a on the negative side in the x-axis direction. The terminal conductor 22c preferably has a rectangular or substantially rectangular frame shape on the top surface of the line portion 18a-c. The terminal conductor 22c is connected to the end of the main conductor 22a on the positive side in the x-axis direction.

The auxiliary ground conductor (first ground conductor) 24 is a conductor layer provided on the negative side in the z-axis direction relative to the signal line 20, as shown in FIG. 2. More specifically, the auxiliary ground conductor 24 is arranged on the bottom surface of the dielectric sheet 18c so as to be opposite to the signal line 20 with the dielectric sheet 18c positioned therebetween. The auxiliary ground conductor 24 is preferably made of a metal material including silver or copper and having a low specific resistance. Here, the auxiliary ground conductor 24 is provided on the bottom surface of the dielectric sheet 18c preferably by patterning metal foil formed by plating the bottom surface of the dielectric sheet 18c or by patterning metal foil attached to the bottom surface of the dielectric sheet 18c. Moreover, the top surface of the auxiliary ground conductor 24 is smoothened, so that surface roughness of the auxiliary ground conductor 24 is greater on the side that contacts the dielectric sheet 18c than on the side that does not contact the dielectric sheet 18c.

Furthermore, the auxiliary ground conductor 24 includes a main conductor 24a and terminal conductors 24b and 24c, as shown in FIGS. 2, 3, 5, and 6. The main conductor 24a is provided on the bottom surface of the line portion 18c-a, and extends in the x-axis direction. The terminal conductor 24b preferably has a rectangular or substantially rectangular frame shape on the bottom surface of the line portion 18c-b. The terminal conductor 24b is connected to the end of the main conductor 24a on the negative side in the x-axis direction. The terminal conductor 24c preferably has a rectangular or substantially rectangular frame shape on the bottom surface of the connecting portion 18c-c. The terminal conductor 24c is connected to the end of the main conductor 24a on the positive side in the x-axis direction.

Furthermore, the main conductor 24a includes a plurality of openings 30 preferably in the form of rectangles arranged in the x-axis direction, as shown in FIGS. 2 and 3. Accordingly, the main conductor 24a preferably has a ladder-shaped configuration. Moreover, portions of the main conductor 24a that are positioned between adjacent openings 30 will be referred to as bridge portions 60. The bridge portions 60 extend in the y-axis direction. The openings 30 and the bridge portions 60, when viewed in a plan view in the z-axis direction, alternatingly overlap with the signal line 20. In the present preferred embodiment, the signal line 20 extends in the x-axis direction so as to cross the centers of the openings 30 and the bridge portions 60 in the y-axis direction.

In this manner, the reference ground conductor 22 has no openings, and the auxiliary ground conductor 24 includes openings. Accordingly, the overlap of the reference ground conductor 22 and the signal line 20 is greater in area than the overlap of the auxiliary ground conductor 24 and the signal line 20.

The external terminal 16a preferably is a rectangular or substantially rectangular conductor located at the center on the top surface of the connecting portion 18a-b, as shown in FIG. 2. Accordingly, the external terminal 16a, when viewed in a plan view in the z-axis direction, overlaps with the end of the signal line 20 that is located on the negative side in the x-axis direction. The external terminal 16b preferably is a rectangular or substantially rectangular conductor located at the center on the top surface of the connecting portion 18a-c, as shown in FIG. 2. Accordingly, the external terminal 16b, when viewed in a plan view in the z-axis direction, overlaps with the end of the signal line 20 that is located on the positive side in the x-axis direction. The external terminals 16a and 16b are preferably made of a metal material including silver or copper and having a low specific resistance. Moreover, the top surfaces of the external terminals 16a and 16b are plated with Ni and Au. Here, the external terminals 16a and 16b are provided on the top surface of the dielectric sheet 18a preferably by patterning metal foil formed by plating the top surface of the dielectric sheet 18a or by patterning metal foil attached to the top surface of the dielectric sheet 18a. Moreover, the top surfaces of the external terminals 16a and 16b are smoothened, so that surface roughness of the external terminals 16a and 16b is greater on the side that contacts the dielectric sheet 18a than on the side that does not contact the dielectric sheet 18a.

The external terminal 16a, the external terminal 16b, the signal line 20, the reference ground conductor 22, and the auxiliary ground conductor 24 are equal or approximately equal in thickness. For example, the external terminal 16a, the external terminal 16b, the signal line 20, the reference ground conductor 22, and the auxiliary ground conductor 24 preferably are about 10 µm to about 20 µm thick.

In this manner, the signal line 20 is positioned between the reference ground conductor 22 and the auxiliary ground conductor 24 in the z-axis direction. That is, the signal line 20, the reference ground conductor 22, and the auxiliary ground conductor 24 define a tri-plate stripline structure. Moreover, the gap between the signal line 20 and the reference ground conductor 22 (the distance therebetween in the z-axis direction) preferably is, for example, from about 50 µm to about 300 µm, which is equal or approximately equal to the total of the thickness D1 of the dielectric sheet 18a and the thickness D2 of the dielectric sheet 18b, as shown in FIGS. 5 and 6. In the present preferred embodiment, the gap between the signal line 20 and the reference ground conductor 22 preferably is about 150 µm, for example. On the other hand, the gap between the signal line 20 and the auxiliary ground conductor 24 (the distance therebetween in the z-axis direction) preferably is, for example, from about 10 µm to about 100 µm, which is equal or approximately equal to the thickness D3 of the dielectric sheet 18c, as shown in FIGS. 5 and 6. In the present preferred embodiment, the gap between the signal line 20 and the auxiliary ground conductor 24 preferably is about 50 µm, for example. That is, the distance between the signal line 20 and the reference ground conductor 22 in the z-axis direction is greater than the distance between the signal line 20 and the auxiliary ground conductor 24 in the z-axis direction.

The via-hole conductors B1 pierce through the dielectric sheet 18a in the z-axis direction and are aligned at equal or substantially equal intervals in the x-axis direction on the positive side in the y-axis direction relative to the signal line 20, as shown in FIG. 2. The via-hole conductors B2 pierce through the dielectric sheet 18b in the z-axis direction and are aligned at equal intervals in the x-axis direction on the positive side in the y-axis direction relative to the signal line 20, as shown in FIG. 2. The via-hole conductors B3 pierce through the dielectric sheet 18c in the z-axis direction and are aligned at equal or substantially equal intervals in the x-axis direction on the positive side in the y-axis direction relative to the signal line 20, as shown in FIG. 2. The via-hole conductors B1 to B3 are connected to one another, such that each set constitutes a single via-hole conductor. In addition, the end of the via-hole conductor B1 that is located on the positive side in the z-axis direction is connected to the reference ground conductor 22. The end of the via-hole conductor B3 that is located on the negative side in the z-axis direction is connected to the auxiliary ground conductor 24, more specifically, on the positive side in the y-axis direction relative to the bridge portion 60. The via-hole conductors B1 to B3 are formed preferably by solidifying a conductive paste including silver, tin, copper, or the like, and filling via holes provided in the dielectric sheets 18a to 18c.

The via-hole conductors B4 pierce through the dielectric sheet 18a in the z-axis direction and are aligned at equal or substantially equal intervals in the x-axis direction on the negative side in the y-axis direction relative to the signal line 20, as shown in FIG. 2. The via-hole conductors B5 pierce through the dielectric sheet 18b in the z-axis direction and are aligned at equal intervals in the x-axis direction on the negative side in the y-axis direction relative to the signal line 20, as shown in FIG. 2. The via-hole conductors B6 pierce through the dielectric sheet 18c in the z-axis direction and are aligned at equal or substantially equal intervals in the x-axis direction on the negative side in the y-axis direction relative to the signal line 20, as shown in FIG. 2. The via-hole conductors B4 to B6 are connected to one another, such that each set constitutes a single via-hole conductor. In addition, the end of the via-hole conductor B4 that is located on the positive side in the z-axis direction is connected to the reference ground conductor 22. The end of the via-hole conductor B6 that is located on the negative side in the z-axis direction is connected to the auxiliary ground conductor 24, more specifically, on the negative side in the y-axis direction relative to the bridge portion 60. The via-hole conductors B4 to B6 are formed preferably by solidifying a conductive paste including silver, tin, copper, or the like, and filling via holes provided in the dielectric sheets 18a to 18c.

The via-hole conductor b1 pierces through the connecting portion 18a-b of the dielectric sheet 18a in the z-axis direction, as shown in FIG. 2. The via-hole conductor b3 pierces through the connecting portion 18b-b of the dielectric sheet 18b in the z-axis direction, as shown in FIG. 2. The via-hole conductors b1 and b3 are connected to each other to constitute a single via-hole conductor. Moreover, the end of the via-hole conductor b1 that is located on the positive side in the z-axis direction is connected to the external terminal 16a. The end of the via-hole conductor b3 that is located on the negative side in the z-axis direction is connected to the end of the signal line 20 that is located on the negative side in the x-axis direction.

The via-hole conductor b2 pierces through the connecting portion 18a-c of the dielectric sheet 18a in the z-axis direction, as shown in FIG. 2. The via-hole conductor b4 pierces through the connecting portion 18b-c of the dielectric sheet 18b in the z-axis direction, as shown in FIG. 2. The via-hole conductors b2 and b4 are connected to each other to constitute a single via-hole conductor. Moreover, the end of the via-hole conductor b2 that is located on the positive side in the z-axis direction is connected to the external terminal 16b. The end of the via-hole conductor b4 that is located on the negative side in the z-axis direction is connected to the end of the signal line 20 that is located on the positive side in the x-axis direction. In this manner, the signal line 20 is connected between the external terminals 16a and 16b. The via-hole conductors b1 to b4 are formed preferably by solidifying a conductive paste including silver, tin, copper, or the like, and filling via holes provided in the dielectric sheets 18a and 18b.

The protective layer 14 is an insulating film provided on the top surface of the dielectric sheet 18a at the end of the positive side in the z-axis direction, so as to cover approximately the entire top surface of the dielectric sheet 18a. Accordingly, the reference ground conductor 22 is covered by the protective layer 14. The specific permittivity $\in 2$ of the protective layer 14 is higher than the specific permittivity $\in 1$ of each of the dielectric sheets 18a to 18c. The protective layer 14 is preferably made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, including the main conductor 22a.

The connecting portion 14b is connected to the end of the line portion 14a on the negative side in the x-axis direction, so as to cover the top surface of the connecting portion 18a-b. The connecting portion 14b includes openings Ha to Hd provided therein. The opening Ha is a rectangular or substantially rectangular opening provided at the center of the connecting portion 14b. The external terminal 16a is exposed to the outside from the opening Ha. The opening Hb is a rectangular or substantially rectangular opening provided on the positive side in the y-axis direction relative to the opening Ha. The opening Hc is a rectangular or substantially rectangular opening provided on the negative side in the x-axis direction relative to the opening Ha. The opening Hd is a rectangular or substantially rectangular opening provided on the negative side in the y-axis direction relative to the opening Ha. The terminal portion 22b is exposed to the outside from the openings Hb to Hd, so that the exposed portions define and serve as external terminals.

The connecting portion 14c is connected to the end of the line portion 14a on the positive side in the x-axis direction, so as to cover the top surface of the connecting portion 18a-c. The connecting portion 14c includes openings He to Hh provided therein. The opening He is a rectangular or substantially rectangular opening positioned at the center of the connecting portion 14c. The external terminal 16b is exposed to the outside from the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside from the openings Hf to Hh, so that the exposed portions define and serve as external terminals.

The protective layer 15 is an insulating film provided on the bottom surface of the dielectric sheet 18c at the end of the negative side in the z-axis direction, so as to cover approximately the entire bottom surface of the dielectric sheet 18c. Accordingly, the auxiliary ground conductor 24 is covered by the protective layer 15. The specific permittivity $\in 2$ of the protective layer 15 is higher than the specific permittivity $\in 1$ of each of the dielectric sheets 18a to 18c. The protective layer 15 is made of, for example, a flexible resin such as a resist material.

The high-frequency signal transmission line 10 includes an undulating portion provided on the bottom surface of the dielectric sheet 18c at the end of the negative side in the z-axis direction, as shown in FIGS. 3 through 6, such that the undulating portion overlaps with the openings 30 when viewed in a plan view in the z-axis direction. More specifically, the undulating portion is formed on the bottom surface of the dielectric sheet 18c by providing grooves G1 and G2 in the bottom surface of the dielectric sheet 18c so as to extend in the x-axis direction along the signal line 20. When viewed in a plan view in the z-axis direction, the groove G1 is a portion of the bottom surface of the dielectric sheet 18c that is positioned on the negative side in the y-axis direction relative to the signal line 20 and recessed toward the positive side in the z-axis direction. When viewed in a plan view in the z-axis direction, the groove G2 is a portion of the bottom surface of the dielectric sheet 18c that is positioned on the positive side in the y-axis direction relative to the signal line 20 and recessed toward the positive side in the z-axis direction. The grooves G1 and G2 do not overlap with the signal line 20 when viewed in a plan view in the z-axis direction. That is, the grooves G1 and G2, when viewed in a plan view in the z-axis direction, are positioned on opposite sides of the signal line 20 in the y-axis direction (i.e., in the width direction of the signal line 20).

Furthermore, the grooves G1 and G2 extend in the x-axis direction, as described earlier, and therefore, overlap with the bridge portions 60 of the auxiliary ground conductor 24 when viewed in a plan view in the z-axis direction, as shown in FIG. 4. Accordingly, as with the dielectric sheet 18c, the bridge portions 60 are undulating. Therefore, the bridge portions 60, when viewed in a plan view in the z-axis direction, protrude toward the positive side in the z-axis direction in the portions that do not overlap with the signal line 20 (i.e., the portions overlapping with the grooves G1 and G2) more than in the portions that overlap with the signal line 20, as shown in FIG. 5.

In the high-frequency signal transmission line 10 thus configured, the characteristic impedance of the signal line 20 switches cyclically between impedance values Z1 and Z2. More specifically, in sections A1 of the signal line 20 that overlap with the openings 30, there is relatively low capacitance generated between the signal line 20 and the auxiliary ground conductor 24. Accordingly, in the sections A1 of the signal line 20, the characteristic impedance takes the impedance value Z1, which is relatively high.

On the other hand, in sections A2 of the signal line 20 that overlap with the bridge portions 60, there is relatively high capacitance generated between the signal line 20 and the auxiliary ground conductor 24. Accordingly, in the sections A2 of the signal line 20, the characteristic impedance takes the impedance value Z2, which is relatively low. The sections A1 and A2 alternate with each other in the x-axis direction. Therefore, the characteristic impedance of the signal line 20 switches cyclically between the impedance values Z1 and Z2. The impedance value Z1 preferably is, for example, about 55Ω, and the impedance value Z2 preferably is, for example, about 45Ω. Moreover, the average characteristic impedance of the entire signal line 20 preferably is, for example, about 50Ω.

The connectors 100a and 100b are mounted on the top surfaces of the connecting portions 12b and 12c, respectively, as shown in FIG. 1. The connectors 100a and 100b have the same configuration, and therefore, only the configuration of the connector 100b will be described below as an example. FIG. 7 is an external oblique view of the connector 100b of the high-frequency signal transmission line 10. FIG. 8 is a cross-sectional structure view of the connector 100b of the high-frequency signal transmission line 10.

The connector 100b includes a connector body 102, external terminals 104 and 106, a center conductor 108, and an external conductor 110, as shown in FIGS. 1, 7, and 8. The connector body 102 includes a rectangular or substantially rectangular plate and a cylindrical or substantially cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c that are exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c, as shown in FIGS. 7 and 8. As a result, the signal conductor 20 is electrically connected to the center conductor 108. In addition, the reference ground conductor 22 and the auxiliary ground conductor 24 are electrically connected to the external conductor 110.

Figure 9:
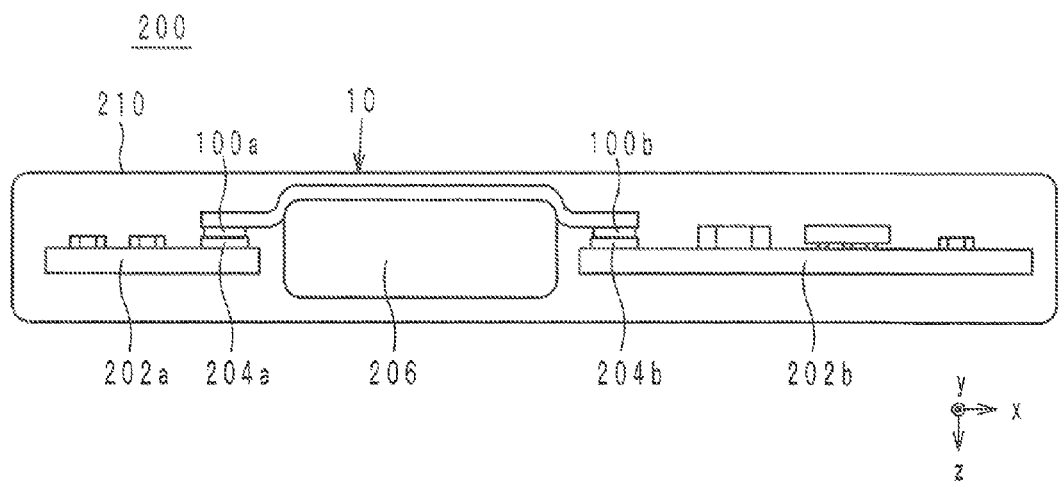
FIG. 9 illustrates an electronic device provided with the high-frequency signal transmission line as viewed in a plan view in the y-axis direction.
Figure 10:
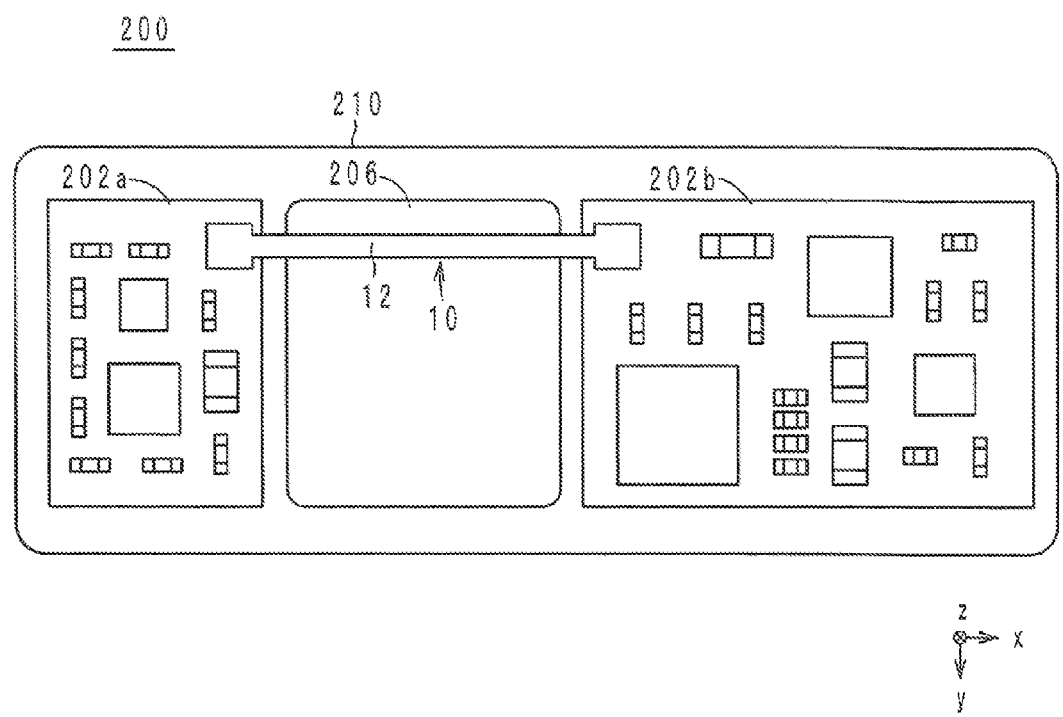
FIG. 10 illustrates the electronic device provided with the high-frequency signal transmission line as viewed in a plan view in the z-axis direction.

The high-frequency signal transmission line 10 is used in a manner as will be described below. FIG. 9 illustrates an electronic device 200 provided with the high-frequency signal transmission line 10 as viewed in a plan view in the y-axis direction. FIG. 10 illustrates the electronic device 200 provided with the high-frequency signal transmission line 10 as viewed in a plan view in the z-axis direction.

The electronic device 200 includes the high-frequency signal transmission line 10, circuit boards 202a and 202b, receptacles 204a and 204b, a battery pack (metallic body) 206, and a housing 210.

The housing 210 accommodates the high-frequency signal transmission line 10, the circuit boards 202a and 202b, the receptacles 204a and 204b, and the battery pack 206. For example, the circuit board 202a has provided thereon a transmission or reception circuit including an antenna. The circuit board 202b has, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal transmission line 10 connects the circuit boards 202a and 202b.

Here, the top surface of the dielectric element assembly 12 (more precisely, the protective layer 14) is in contact with the battery pack 206. The dielectric element assembly 12 and the battery pack 206 are fixed by an adhesive or other suitable material or device. Accordingly, the reference ground conductor 22, which is preferably in the form of a solid without openings, is positioned between the signal conductor 20 and the battery pack 206.

A non-limiting example of a method for producing the high-frequency signal transmission line 10 will be described below with reference to the drawings. FIGS. 11 through 14 are cross-sectional views for the process of pressure bonding of the high-frequency signal transmission line 10. While the following description focuses on one high-frequency signal transmission line 10 as non-limiting example, in actuality, large-sized dielectric sheets are laminated and cut, so that a plurality of high-frequency signal transmission lines 10 are produced at the same time.

Prepared first are dielectric sheets 18a to 18c made of a thermoplastic resin and copper-foiled entirely on their top surfaces (i.e., the top surfaces are coated with metal films). More specifically, copper foil is attached to the top surfaces of the dielectric sheets 18a to 18c. Further, the copper-foiled top surfaces of the dielectric sheets 18a to 18c are smoothened, for example, by galvanization for rust prevention. The dielectric sheets 18a to 18c are sheets of liquid crystal polymer. The thickness of the copper foil preferably is from about 10 μm to about 20 μm, for example.

Next, external terminals 16a and 16b and a reference ground conductor 22, as shown in FIG. 2, are formed on the top surface of the dielectric sheet 18a by patterning the copper foil on the top surface of the dielectric sheet 18a. Specifically, resists are printed on the copper foil of the dielectric sheet 18a in the same shapes as the external terminals 16a and 16b and the reference ground conductor 22 shown in FIG. 2. Then, any portions of the copper foil that are not coated with the resists are removed by etching the copper foil. Thereafter, the resists are removed by spraying a resist solvent. In this manner, the external terminals 16a and 16b and the reference ground conductor 22, as shown in FIG. 2, are formed on the top surface of the dielectric sheet 18a by photolithography.

Next, a signal line 20, as shown in FIG. 2, is formed on the bottom surface of the dielectric sheet 18b. In addition, an auxiliary ground conductor 24, as shown in FIG. 2, is formed on the bottom surface of the dielectric sheet 18c. Note that the steps for forming the signal line 20 and the auxiliary ground conductor 24 are the same as the steps for forming the external terminals 16a and 16b and the ground conductor 22, and therefore, any descriptions thereof will be omitted.

Next, via holes are bored through the dielectric sheets 18a to 18c by irradiating their surfaces with laser beams where via-hole conductors b1 to b4 and B1 to B6 are to be formed. Thereafter, the via holes are filled with a conductive paste, thereby completing the via-hole conductors b1 to b4 and B1 to B6.

Figure 11:
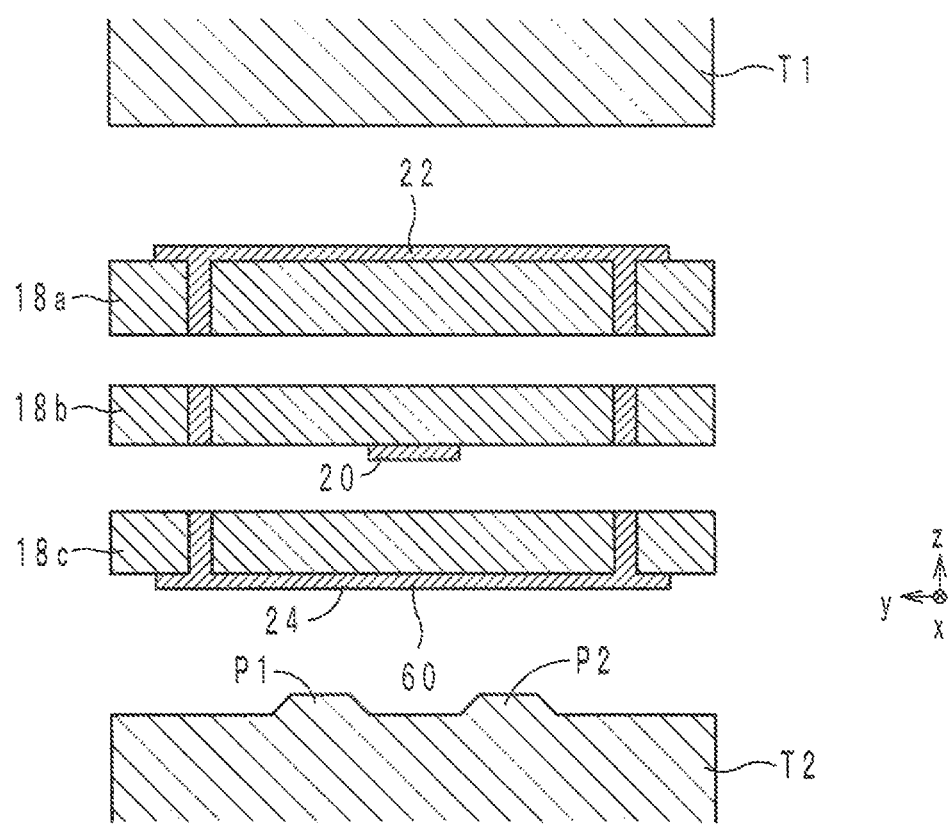
FIG. 11 is a cross-sectional view for the process of pressure bonding of the high-frequency signal transmission line.
Figure 12:
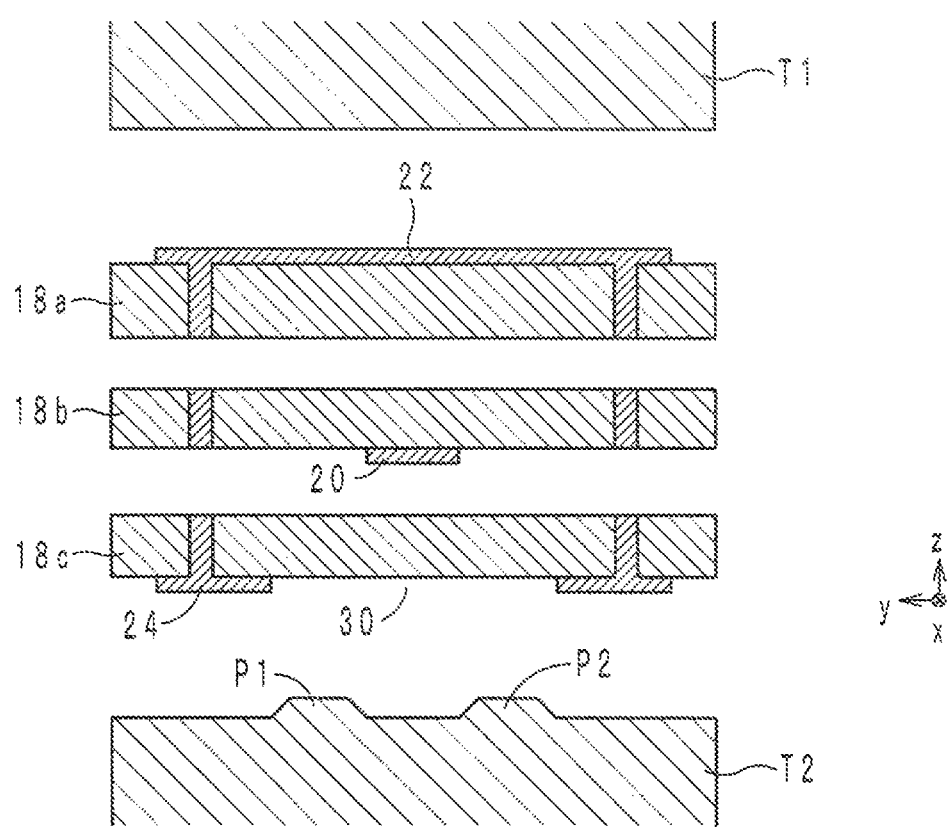
FIG. 12 is another cross-sectional view for the process of pressure bonding of the high-frequency signal transmission line.

Next, the dielectric sheets 18a to 18c are stacked in this order, from the positive side to the negative side in the z-axis direction, and then pressed and heated using crimping tools T1 and T2, as shown in FIGS. 11 and 12. The crimping tools T1 and T2 will be described below.

The crimping tool T1 contacts the top surface of the dielectric sheet 18a, as shown in FIGS. 13 and 14. The contact surface of the crimping tool T1 on the top surface of the dielectric sheet 18a is flat. On the other hand, the crimping tool T2 contacts the bottom surface of the dielectric sheet 18c, as shown in FIGS. 13 and 14. The contact surface of the crimping tool T2 on the bottom surface of the dielectric sheet 18c is undulating. More specifically, the contact surface of the crimping tool T2 has protrusions P1 and P2 projecting in the z-axis direction and extending in the x-axis direction. The position of the protrusion P1 corresponds to a position in which a groove G1 is formed, and the position of the protrusion P2 corresponds to a position in which a groove G2 is formed. The crimping tools T1 and T2 as above include heaters. The crimping tools T1 and T2 heat and press the dielectric sheets 18a to 18c, thus softening the dielectric sheets 18a to 18c. As a result, the dielectric sheets 18a to 18c are bonded, and the grooves G1 and G2 matching the shapes of the protrusions P1 and P2 are provided in the bottom surface of the dielectric sheet 18c, as shown in FIGS. 13 and 14.

Next, a resin (resist) paste is applied to the top surface of the dielectric sheet 18a by screen printing, thus forming a protective layer 14 so as to cover the reference ground conductor 22, as shown in FIG. 2.

Further, a resin (resist) paste is applied to the bottom surface of the dielectric sheet 18c by screen printing, thus forming a protective layer 15 so as to cover the auxiliary ground conductor 24, as shown in FIG. 2. Note that there is no undulating portion formed on the bottom surface of the protective layer 15.

Lastly, connectors 100a and 100b are mounted on the connecting portions 12b and 12c by soldering them to the external terminals 16a and 16b and the terminal portions 22b and 22c. As a result, the high-frequency signal transmission line 10 shown in FIG. 1 is obtained.

The high-frequency signal transmission line 10 thus configured renders it possible to reduce spurious radiation. More specifically, the high-frequency signal transmission line 10 includes the undulating portion provided on the bottom surface of the dielectric sheet 18c, so that some electromagnetic field radiation from inside the high-frequency signal transmission line 10 is diffusely reflected by the undulating portion back into the high-frequency signal transmission line 10. As a result, the energy of the diffusely reflected electromagnetic field radiation is consumed by the reference ground conductor 22, the auxiliary ground conductor 24, or the dielectric element assembly 12. Thus, the high-frequency signal transmission line 10 renders it possible to significantly reduce or prevent spurious radiation.

Further, in the high-frequency signal transmission line 10, the protective layer 15 has the specific permittivity $\in 2$ higher than the specific permittivity $\in 1$ of each of the dielectric sheets 18a to 18c. Accordingly, more electromagnetic field radiation from the signal line 20 is reflected into the high-frequency signal transmission line 10 at the interface between the protective layer 15 and the air space, resulting in reduced spurious radiation from the high-frequency signal transmission line 10. Note that in the high-frequency signal transmission line 10, the undulating portion provided on the bottom surface of the dielectric sheet 18c contributes to reduction in spurious radiation. Therefore, in the case of the high-frequency signal transmission line 10, the specific permittivity $\in 2$ of the protective layer 15 is less than or equal to the specific permittivity of the high-permittivity layer 515 of the high-frequency signal line 500.

Still further, the characteristic impedance of the high-frequency signal transmission line 10 is prevented from deviating from a predetermined impedance value. More specifically, in the high-frequency signal transmission line 10, the undulating portion located on the bottom surface of the dielectric sheet 18c contributes to reduction in spurious radiation. Accordingly, in the case of the high-frequency signal transmission line 10, the specific permittivity $\in 2$ of the protective layer 15 is less than or equal to the specific permittivity of the high-permittivity layer 515 of the high-frequency signal line 500. Therefore, in the case where there is a metallic body, such as the housing of an electronic device, near the openings 30 of the high-frequency signal transmission line 10, capacitance generated between the signal line 20 and the metallic body is prevented from becoming excessively high. Thus, the characteristic impedance of the high-frequency signal transmission line 10 is prevented from deviating from the predetermined impedance value. In addition, even if there is inconsistency in the distance between the high-frequency signal transmission line 10 and the metallic body because of production variability, the capacitance generated between the signal line 20 and the metallic body is low, and therefore, there is little inconsistency in the capacitance. Thus, the characteristic impedance of the high-frequency signal transmission line 10 is prevented from becoming inconsistent.

Yet further, the high-frequency signal transmission line 10 can be made thin. More specifically, in the high-frequency signal transmission line 10, the signal line 20, when viewed in a plan view in the z-axis direction, does not overlap with the auxiliary ground conductor 24 in the sections A1. Accordingly, less capacitance is generated between the signal line 20 and the auxiliary ground conductor 24. Therefore, even if the distance between the signal line 20 and the auxiliary ground conductor 24 in the z-axis direction is reduced, the capacitance generated between the signal line 20 and the auxiliary ground conductor 24 is prevented from becoming excessively high. As a result, the characteristic impedance of the signal line 20 is less likely to deviate from a predetermined impedance value (e.g., about 50Ω). Thus, it is possible to make the high-frequency signal transmission line 10 thin while maintaining the characteristic impedance of the signal line 20 at the predetermined impedance value.

Yet further, in the case where the high-frequency signal transmission line 10 is attached to a metallic body such as the battery pack 206, fluctuations in characteristic impedance of the signal line 20 are prevented. More specifically, the high-frequency signal transmission line 10 is attached to the battery pack 206, such that the reference ground conductor 22, which is in the form of a solid without openings, is positioned between the signal line 20 and the battery pack 206. Accordingly, the signal line 20 does not face the battery pack 206 through any openings, which prevents capacitance from being generated between the signal line 20 and the battery pack 206. As a result, attaching the high-frequency signal transmission line 10 to the battery pack 206 prevents the characteristic impedance of the signal line 20 from being reduced.

Yet further, the high-frequency signal transmission line 10 renders it possible to reduce insertion loss. More specifically, when a current flows through the signal line 20, electrical lines of force are generated between the reference ground conductor 22 and the signal line 20. As for electrical lines of force between two objects, current density between the objects increases as the distance therebetween decreases. Accordingly, the current path through the reference ground conductor 22 narrows, so that less current flows through the reference ground conductor 22.

Therefore, the grooves G1 and G2, when viewed in a plan view in the z-axis direction, are positioned on opposite sides of the signal line 20 in the y-axis direction, as shown in FIG. 5. Accordingly, the area of the reference ground conductor 22 that is spaced approximately at a uniform distance from the signal line 20 is widened. Therefore, a current flows through the wider area of the reference ground conductor 22, facilitating current flow through the signal line 20. Thus, insertion loss in the high-frequency signal transmission line 10 is significantly reduced or prevented.

Further, the high-frequency signal transmission line 10 renders it possible to inhibit the characteristic impedance from varying among positions in the x-axis direction. More specifically, the high-frequency signal transmission line 10 has the grooves G1 and G2 provided across the entire length of the line portion 12a. Accordingly, the cross-sectional structure of the line portion 12a is uniform or approximately uniform. As a result, the high-frequency signal transmission line 10 renders it possible to prevent the characteristic impedance from varying among positions in the x-axis direction.

Still further, since the dielectric element assembly 12 has the grooves G1 and G2 provided along the signal line 20, the dielectric element assembly 12 is less bendable along the length of the signal line 20.

First Modification

Figure 15:
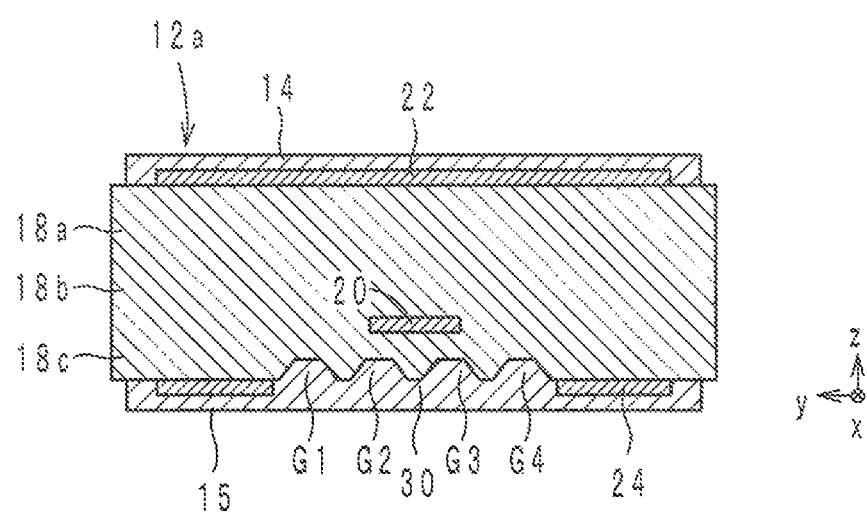
FIG. 15 is a cross-sectional structure view of a line portion of a high-frequency signal transmission line according to a first modification of a preferred embodiment of the present invention.

Hereinafter, a high-frequency signal transmission line according to a first modification of a preferred embodiment of the present invention will be described with reference to the drawings. FIG. 15 is a cross-sectional structure view of a line portion 12a of the high-frequency signal transmission line 10a according to the first modification. For the external oblique view of the high-frequency signal transmission line 10a, FIG. 1 will be referenced.

The high-frequency signal transmission line 10a differs from the high-frequency signal transmission line 10 in the number of grooves. More specifically, the high-frequency signal transmission line 10a includes four grooves G1 to G4 provided therein, so that the dielectric sheet 18c includes an undulating portion in the area of the bottom surface that overlaps with the openings 30 when viewed in a plan view in the z-axis direction. Moreover, the grooves G2 and G3 overlap with the signal line 20 when viewed in a plan view in the z-axis direction.

The high-frequency signal transmission line 10a thus configured includes more grooves G1 to G4 than the high-frequency signal transmission line 10, which facilitates diffuse reflection of electromagnetic field radiation by the bottom surface of the dielectric sheet 18c. Thus, the high-frequency signal transmission line 10a renders it possible to reduce or prevent spurious radiation more effectively.

Note that the high-frequency signal transmission line 10a preferably is produced in the same manner as the high-frequency signal transmission line 10. However, in the high-frequency signal transmission line 10a, the signal line 20 overlaps with the grooves G2 and G3. The signal line 20 is more resistant to deformation than the dielectric sheets 18a to 18c. Accordingly, when compared to the grooves G1 and G4, the grooves G2 and G3 are more difficult to be provided in the high-frequency signal transmission line 10a. In other words, in the high-frequency signal transmission line 10, the grooves G1 and G2 do not overlap with the signal line 20, so that the undulating portion can be formed readily. In addition, since the grooves G1 and G2 of the high-frequency signal transmission line 10 do not overlap with the signal line 20, the characteristic impedance of the high-frequency signal transmission line 10 is less likely to vary even if there is production variability in, for example, the size or depth of the undulating portion at the grooves G1 and G2.

Second Modification

Figure 16:
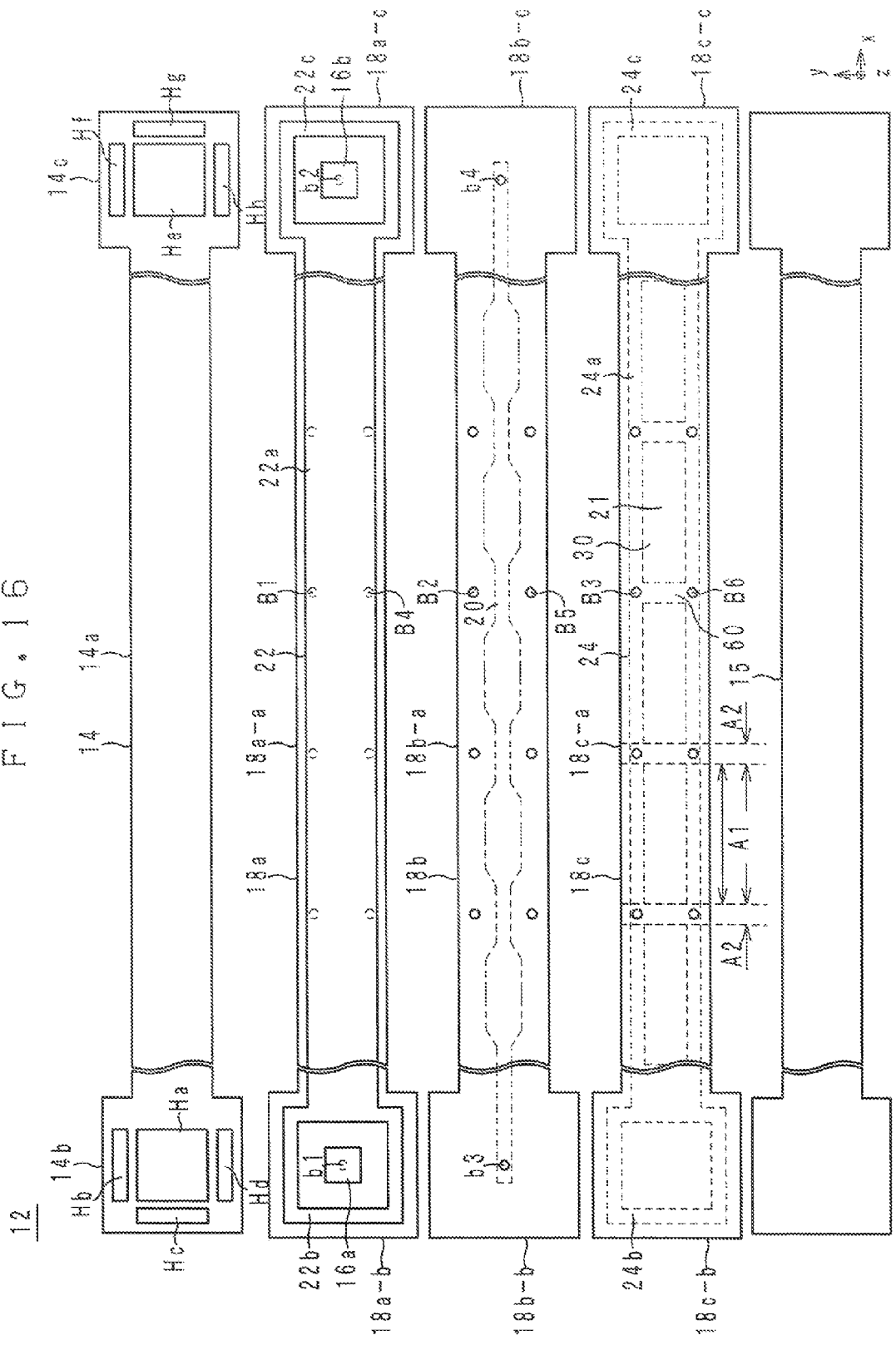
FIG. 16 is an exploded view of a laminate of a high-frequency signal transmission line according to a second modification of a preferred embodiment of the present invention.
Figure 17:
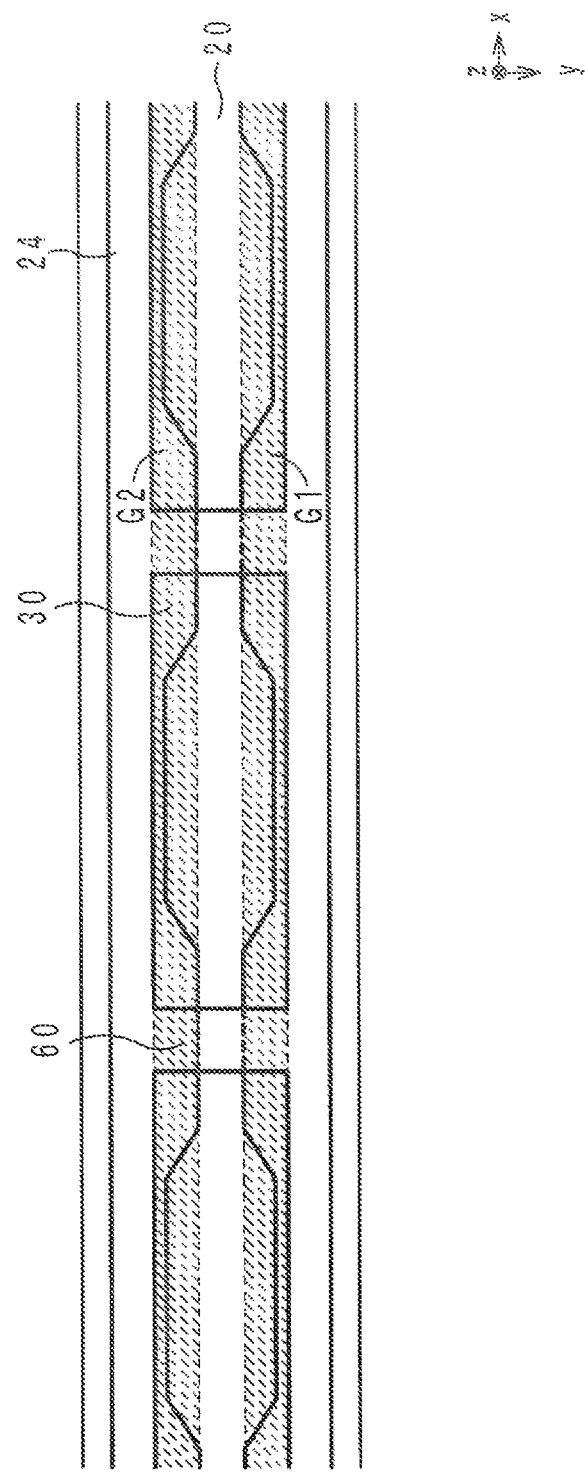
FIG. 17 is a plan view of a line portion of the high-frequency signal transmission line in FIG. 16.
Figure 20:
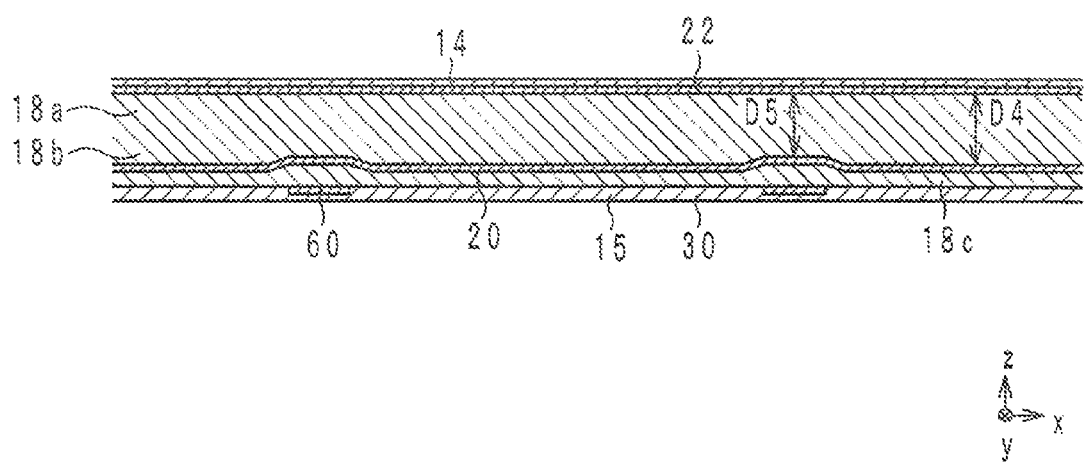
FIG. 20 is a cross-sectional structure view of the line portion taken along a signal line.

Hereinafter, a high-frequency signal transmission line according to a second modification of a preferred embodiment of the present invention will be described with reference to the drawings. FIG. 16 is an exploded view of a dielectric element assembly 12 of the high-frequency signal transmission line 10b according to the second modification. FIG. 17 is a plan view of a line portion 12a of the high-frequency signal transmission line 10b. FIG. 18 is a cross-sectional structure view of the line portion 12a taken at the bridge portion 60. FIG. 19 is a cross-sectional structure view of the line portion 12a taken at the opening 30. FIG. 20 is a cross-sectional structure view of the line portion 12a taken along the signal line 20. For the external oblique view of the high-frequency signal transmission line 10b, FIG. 1 will be referenced.

The high-frequency signal transmission line 10b differs from the high-frequency signal transmission line 10 in that the width of the signal line 20 is not uniform, as shown in FIGS. 16 through 19. More specifically, the bridge portion 60 is provided in the section A2, as shown in FIG. 20, and therefore, the thickness of the high-frequency signal transmission line 10b in the z-axis direction is greater in the section A2 than in the section A1 by the thickness of the bridge portion 60. Accordingly, at the time of pressure bonding, the signal line 20 in the section A2 is pushed by the bridge portion 60 toward the positive side in the z-axis direction. As a result, the signal line 20 winds in the xz cross section, as shown in FIG. 20. More specifically, the distance D5 between the overlap of the signal line 20 with the bridge portion 60 and the reference ground conductor 22 in the z-axis direction is shorter than the distance D4 between the overlap of the signal line 20 with the opening 30 and the reference ground conductor 22 in the z-axis direction. Therefore, less capacitance is generated between the signal line 20 and the reference ground conductor 22 in the section A1 than in the section A2.

Therefore, the overlap of the signal line 20 with the opening 30 (i.e., the signal line 20 in the section A1) is increased in width so as to be wider than the overlap of the signal line 20 with the bridge portion 60 (i.e., the signal line 20 in the section A2), as shown in FIGS. 16 through 19. Thus, the resistance value of the signal line 20 is reduced without increasing the capacitance generated between the signal line 20 and the reference ground conductor 22. That is, insertion loss in the high-frequency signal transmission line 10b is reduced without causing the characteristic impedance of the high-frequency signal transmission line 10b to fluctuate from a predetermined impedance value.

Third Modification

Figure 21:
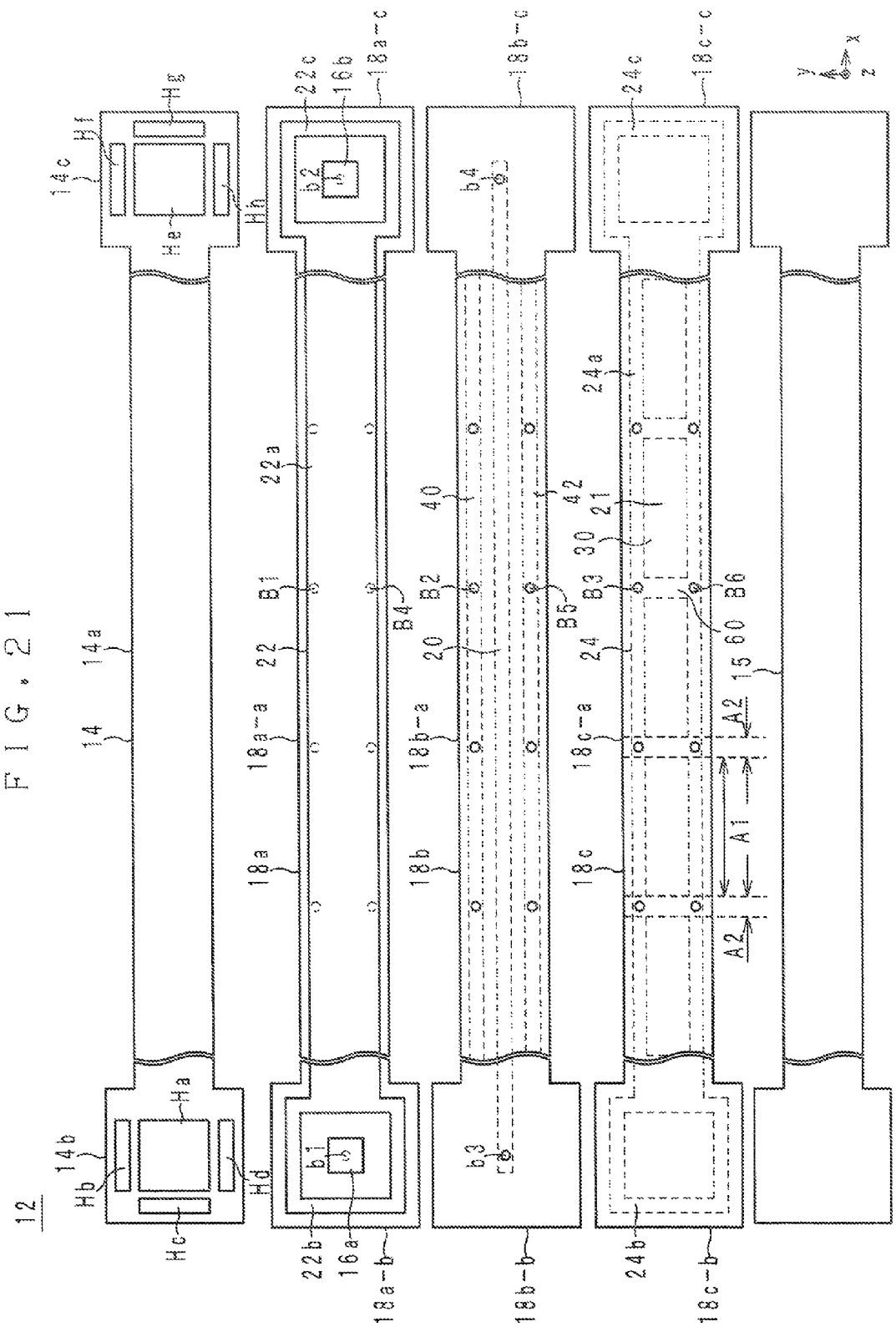
FIG. 21 is an exploded view of a high-frequency signal transmission line according to a third modification of a preferred embodiment of the present invention.

Hereinafter, a high-frequency signal transmission line 10c according to a third modification of a preferred embodiment of the present invention, along with its production method, will be described with reference to the drawings. FIG. 21 is an exploded view of the high-frequency signal transmission line 10c according to the third modification. For the external oblique view of the high-frequency signal transmission line 10c, FIG. 1 will be referenced.

The high-frequency signal transmission line 10c differs from the high-frequency signal transmission line 10 in that reinforcing ground conductors 40 and 42 are provided, as shown in FIG. 21. More specifically, the reinforcing ground conductor 40 is provided on the bottom surface of the dielectric sheet 18b, and extends in the x-axis direction. The reinforcing ground conductor 40, when viewed in a plan view in the z-axis direction, is positioned on the positive side in the y-axis direction relative to the signal line 20, so as to overlap with the auxiliary ground conductor 24 but not with the openings 30 and the bridge portions 60.

Furthermore, the reinforcing ground conductor 42 is provided on the bottom surface of the dielectric sheet 18b, and extends in the x-axis direction. The reinforcing ground conductor 42, when viewed in a plan view in the z-axis direction, is positioned on the negative side in the y-axis direction relative to the signal line 20, so as to overlap with the auxiliary ground conductor 24 but not with the openings 30 and the bridge portions 60.

The method for producing the high-frequency signal transmission line 10c thus configured will be described with reference to the drawings. FIGS. 22 through 25 are cross-sectional views for the process of pressure bonding of the high-frequency signal transmission line 10c. While the following description focuses on one high-frequency signal transmission line 10c as an example, in actuality, large-sized dielectric sheets are laminated and cut, so that a plurality of high-frequency signal transmission lines 10c are produced at the same time.

The method for producing the high-frequency signal transmission line 10c differs from the method for producing the high-frequency signal transmission line 10 in the pressure bonding process. Therefore, the pressure bonding process will be described below.

Figure 22:
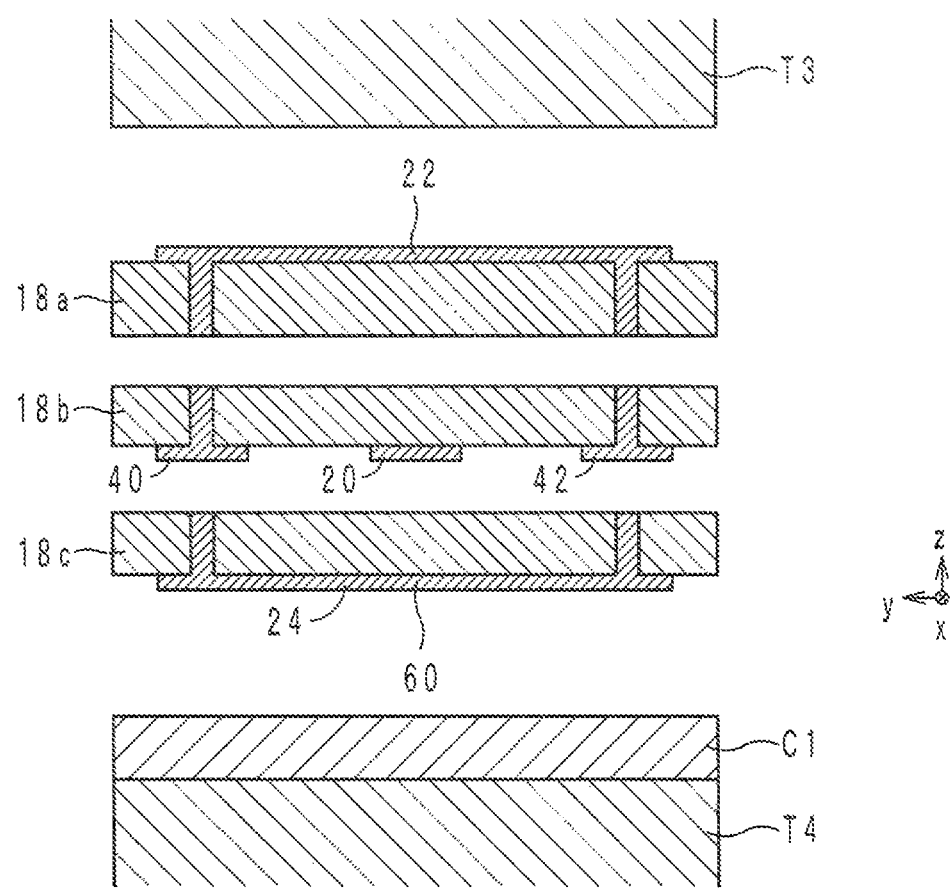
FIG. 22 is a cross-sectional view for the process of pressure bonding of the high-frequency signal transmission line in FIG. 21.
Figure 23:
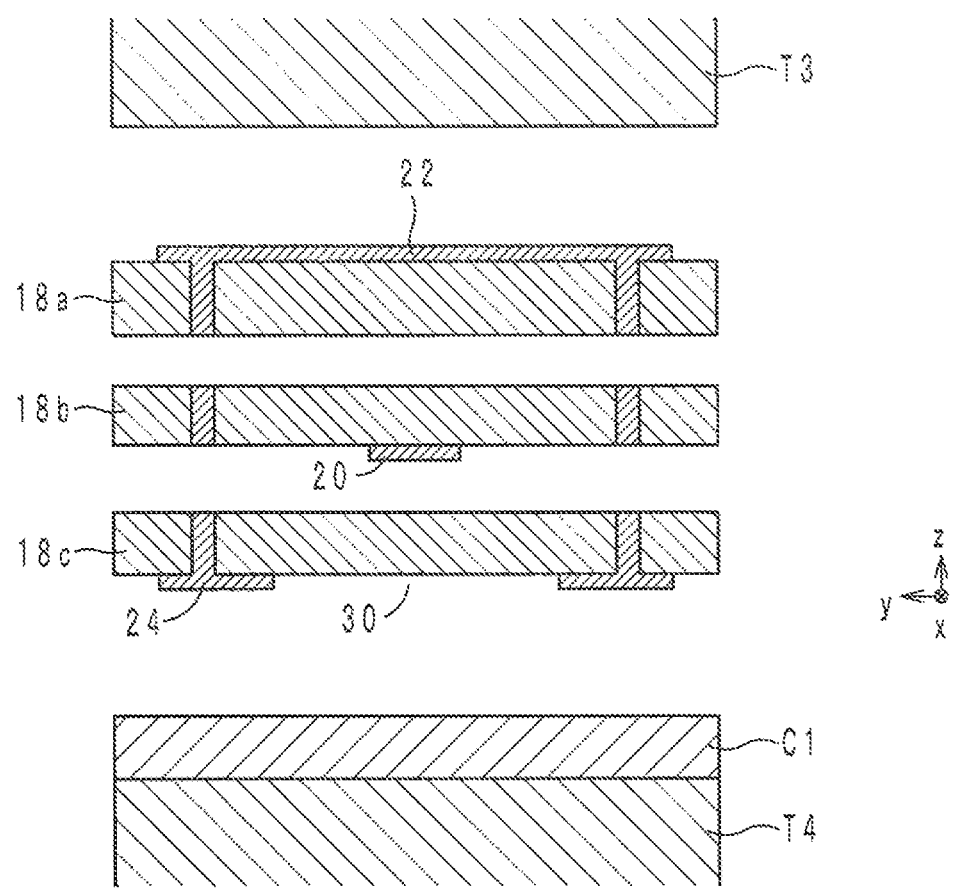
FIG. 23 is another cross-sectional view for the process of pressure bonding of the high-frequency signal transmission line.

First, dielectric sheets 18a to 18c are stacked in this order, from the positive side to the negative side in the z-axis direction, and then pressed and heated using crimping tools T3 and T4, as shown in FIGS. 22 and 23. The crimping tool T3 presses the top surface of the dielectric sheet 18a. The contact surface of the crimping tool T3 on the top surface of the dielectric sheet 18a is flat. On the other hand, the crimping tool T4 presses the bottom surface of the dielectric sheet 18c with a cushion C1 positioned therebetween. The contact surface of the crimping tool T4 on the cushion C1 is flat. The cushion C1 is an elastic sheet made of rubber or other suitable material. The crimping tools T3 and T4 preferably include heaters.

Figure 24:
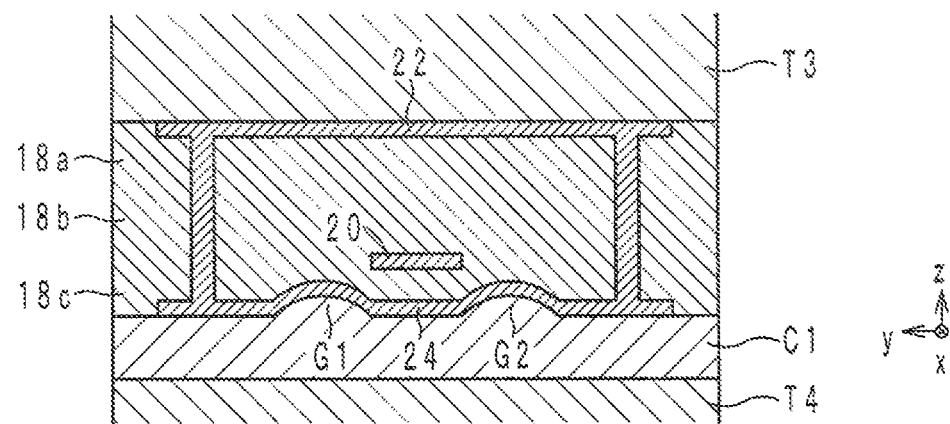
FIG. 24 is another cross-sectional view for the process of pressure bonding of the high-frequency signal transmission line.
Figure 25:
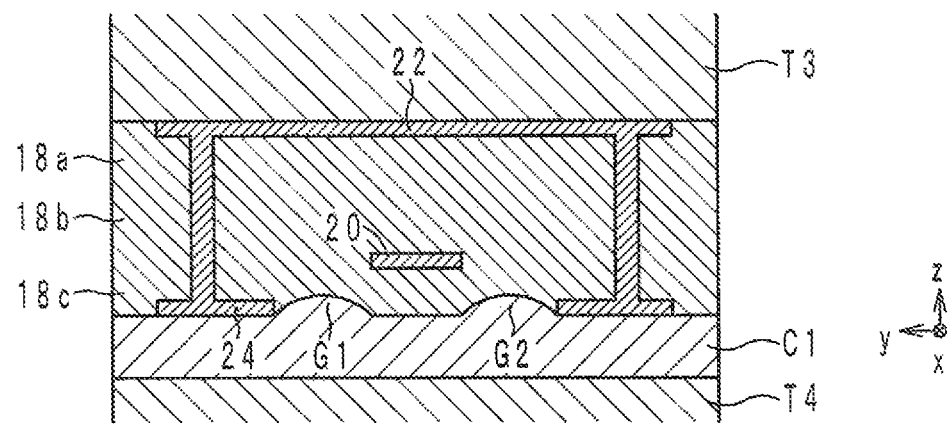
FIG. 25 is another cross-sectional view for the process of pressure bonding of the high-frequency signal transmission line.

The crimping tools T3 and T4 heat and press the dielectric sheets 18a to 18c, thus softening the dielectric sheets 18a to 18c. Here, the dielectric sheet 18b includes a signal line 20 and reinforcing ground conductors 40 and 42 provided on the bottom surface. Accordingly, overlaps of the dielectric sheet 18c with openings 30, when viewed in a plan view in the z-axis direction, are capable of being changed in shape more readily than overlaps of the dielectric sheet 18c with the signal line 20 and the reinforcing ground conductors 40 and 42, when viewed in a plan view in the z-axis direction. Therefore, the shape of the cushion C1 is changed so that grooves G1 and G2 are provided in the bottom surface of the dielectric sheet 18c, as shown in FIGS. 24 and 25.

In the high-frequency signal transmission line 10c thus configured, electromagnetic field radiation from the signal line 20 is absorbed into the reinforcing ground conductors 40 and 42. Thus, the high-frequency signal transmission line 10c renders it possible to reduce spurious radiation more effectively.

Fourth Modification

Figure 26:
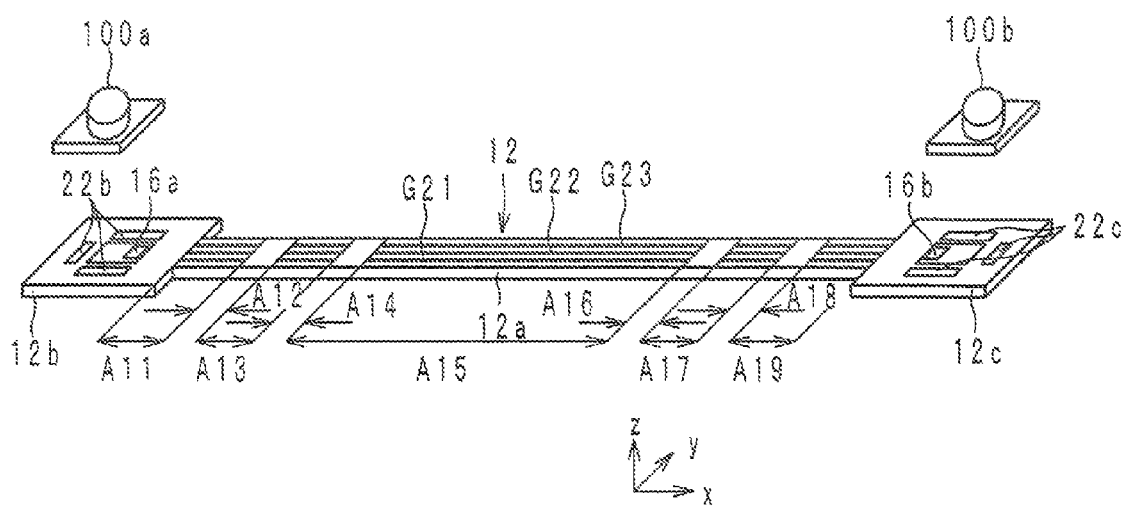
FIG. 26 is an external oblique view of a high-frequency signal transmission line according to a fourth modification of a preferred embodiment of the present invention.
Figure 27:
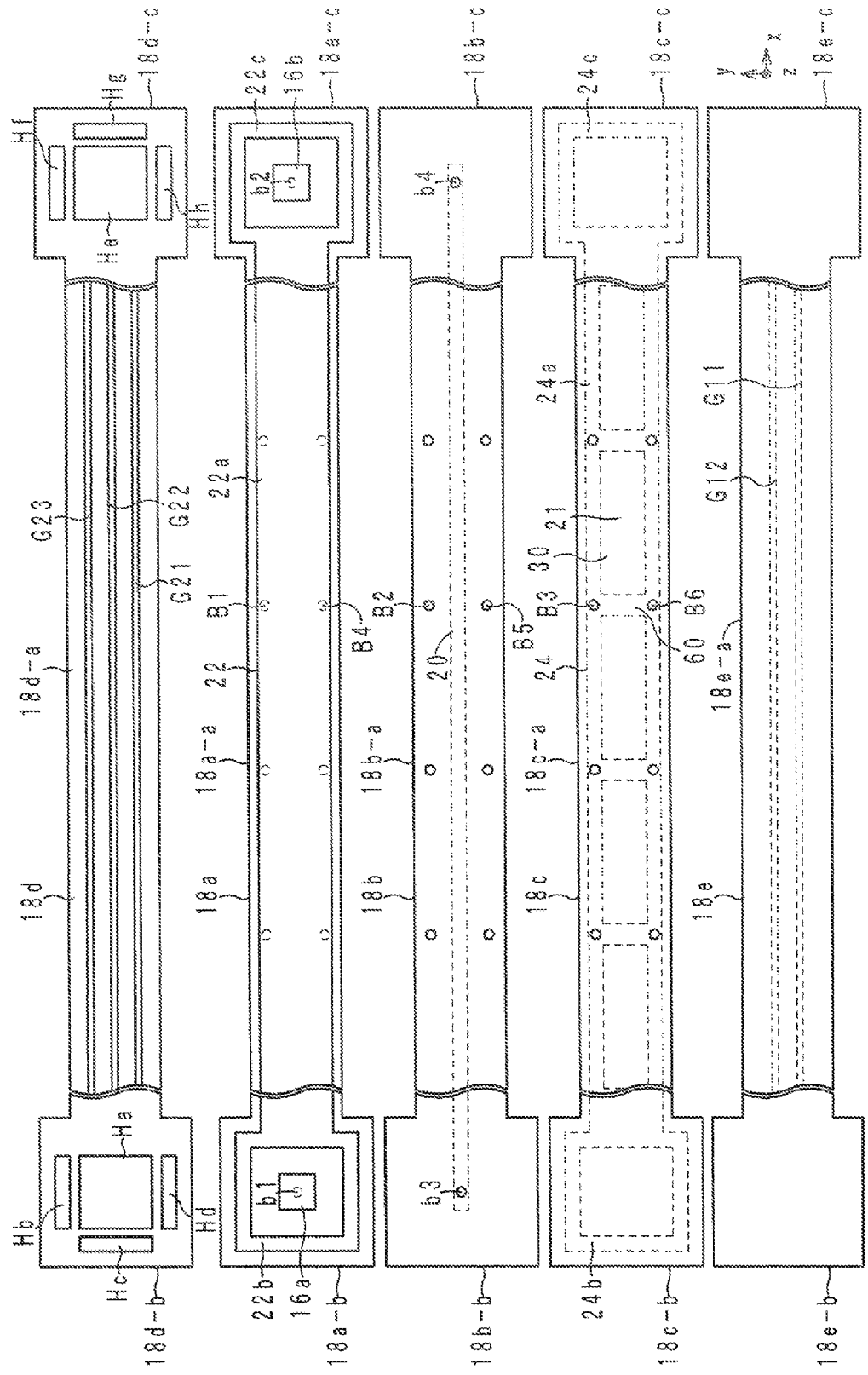
FIG. 27 is an exploded view of a dielectric element assembly of the high-frequency signal transmission line in FIG. 26.
Figure 28:
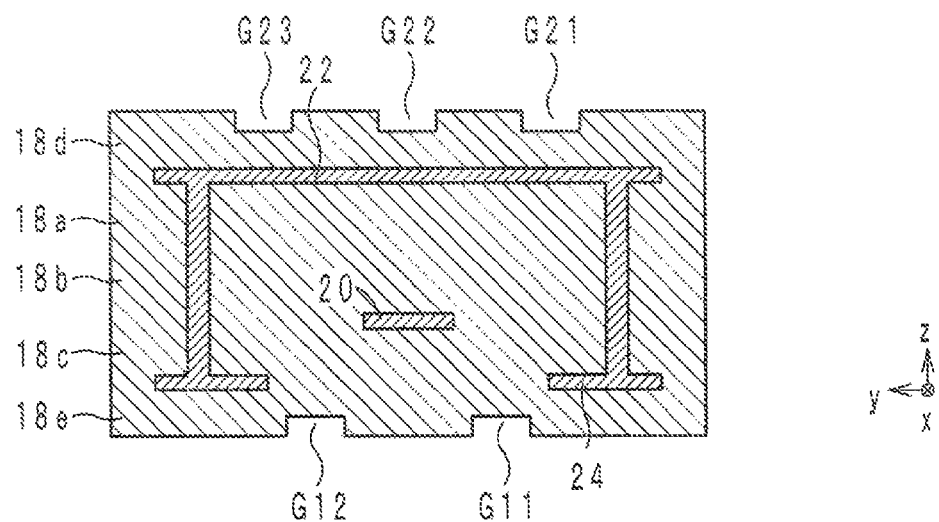
FIG. 28 is a cross-sectional structure view of the high-frequency signal transmission line as taken at a section A11, A13, A15, A17, or A19 in FIG. 26.
Figure 29:
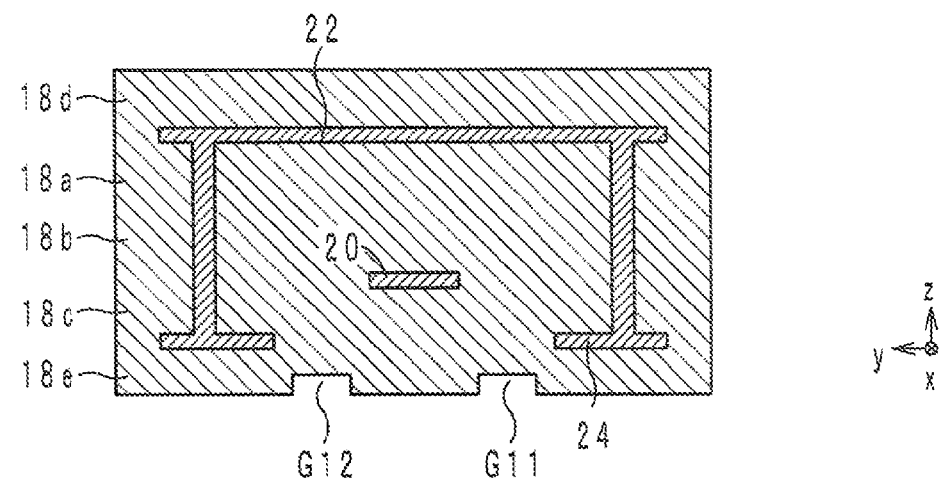
FIG. 29 is a cross-sectional structure view of the high-frequency signal transmission line as taken at a section A12, A14, A16, or A18 in FIG. 26.

Hereinafter, the configuration of a high-frequency signal transmission line according to a fourth modification of a preferred embodiment of the present invention will be described with reference to the drawings. FIG. 26 is an external oblique view of the high-frequency signal transmission line 10d according to the fourth modification. FIG. 27 is an exploded view of a dielectric element assembly 12 of the high-frequency signal transmission line 10d in FIG. 26. FIG. 28 is a cross-sectional structure view of the high-frequency signal transmission line 10d as taken at a section A11, A13, A15, A17, or A19 in FIG. 26. FIG. 29 is a cross-sectional structure view of the high-frequency signal transmission line 10d as taken at a section A12, A14, A16, or A18 in FIG. 26.

The high-frequency signal transmission line 10d differs from the high-frequency signal transmission line 10 in that grooves G11, G12, and G21 to G23 are provided in place of the grooves G1 and G2. The high-frequency signal transmission line 10d will be described below, focusing on the difference. Any features of the high-frequency signal transmission line 10d that are the same as those of the high-frequency signal transmission line 10 will be denoted by the same reference characters.

The dielectric element assembly 12 of the high-frequency signal transmission line 10d is formed by laminating dielectric sheets 18d, 18a to 18c, and 18e in this order, from the positive side to the negative side in the z-axis direction. The dielectric sheets 18*d* and 18*e* have the same shape as the dielectric sheets 18*a* to 18*c*. Moreover, the dielectric sheet 18*d* includes openings Ha to Hh provided therein. The openings Ha to Hh of the dielectric sheet 18*d* are the same as those of the protective layer 14, and therefore, any descriptions thereof will be omitted.

Furthermore, the dielectric element assembly 12 includes sections A11 to A19 arranged in this order, from the negative side to the positive side in the x-axis direction, as shown in FIG. 26. The sections A11, A13, A15, A17, and A19 are not bent for use. On the other hand, the sections A12, A14, A16, and A18 are bent for use.

The high-frequency signal transmission line 10*d* includes an undulating portion provided on a principal surface of the dielectric sheet 18*e* at the end of the negative side in the z-axis direction, the principal surface being located on the negative side in the z-axis direction, i.e., the bottom surface, and the undulating portion overlaps with openings 30 when viewed in a plan view in the z-axis direction, as shown in FIGS. 27 through 29. More specifically, the undulating portion is formed on the bottom surface of the dielectric sheet 18*e* by providing the grooves G11 and G12 in the bottom surface of the dielectric sheet 18*e* so as to extend in the x-axis direction along the signal line 20. Since the bottom surface of the dielectric sheet 18*e* is the bottom surface of the dielectric element assembly 12, the grooves G11 and G12 are positioned in the bottom surface of the dielectric element assembly 12.

The groove G11 is a portion of the bottom surface of the dielectric sheet 18*e*, which, when viewed in a plan view in the z-axis direction, is positioned on the negative side in the y-axis direction relative to the signal line 20 and recessed toward the positive side in the z-axis direction. The groove G12 is a portion of the bottom surface of the dielectric sheet 18*e*, which, when viewed in a plan view in the z-axis direction, is positioned on the positive side in the y-axis direction relative to the signal line 20 and recessed toward the positive side in the z-axis direction. The grooves G11 and G12, when viewed in a plan view in the z-axis direction, do not overlap with the signal line 20. That is, the grooves G11 and G12, when viewed in a plan view in the z-axis direction, are positioned on opposite sides of the signal line 20 in the y-axis direction (i.e., in the width direction of the signal line 20).

Furthermore, the grooves G11 and G12 extend in the x-axis direction, as described earlier, and therefore, overlap with the bridge portions 60 of the auxiliary ground conductor 24 when viewed in a plan view in the z-axis direction, as shown in FIG. 27. However, unlike in the high-frequency signal transmission line 10, the bridge portions 60 of the high-frequency signal transmission line 10*d* are not undulating.

Furthermore, the grooves G21 to G23 are positioned on a principal surface of the dielectric sheet 18*d* at the end of the positive side in the z-axis direction, the principal surface being located on the positive side in the z-axis direction, i.e., the top surface, as shown in FIGS. 27 through 29. Since the top surface of the dielectric sheet 18*d* is the top surface of the dielectric element assembly 12, the grooves G11 and G12 are positioned in the top surface of the dielectric element assembly 12.

The groove G21 is a portion of the top surface of the dielectric sheet 18*d*, which, when viewed in a plan view in the z-axis direction, is positioned on the negative side in the y-axis direction relative to the signal line 20 and recessed toward the negative side in the z-axis direction. The groove G22 is a portion of the top surface of the dielectric sheet 18*d*, which, when viewed in a plan view in the z-axis direction, overlaps with the signal line 20 and is recessed toward the negative side in the z-axis direction. The groove G23 is a portion of the top surface of the dielectric sheet 18*d*, which, when viewed in a plan view in the z-axis direction, is positioned on the positive side in the y-axis direction relative to the signal line 20 and recessed toward the negative side in the z-axis direction.

Furthermore, the grooves G21 to G23 extend through the sections A11, A13, A15, A17, and A19 but are interrupted by the sections A12, A14, A16, and A18 intervening therebetween, as shown in FIG. 26. Accordingly, the sections A11, A13, A15, A17, and A19 of the dielectric element assembly 12 are more resistant to bending than the sections A12, A14, A16, and A18 of the dielectric element assembly 12, as will be described later. Other features of the high-frequency signal transmission line 10*d* are the same as those of the high-frequency signal transmission line 10, and therefore, any descriptions thereof will be omitted.

Next, a non-limiting example of a method for producing the high-frequency signal transmission line 10*d* will be described with reference to the drawings. FIGS. 30 and 31 are cross-sectional views for the process of pressure bonding of the high-frequency signal transmission line 10*d*.

The method for producing the high-frequency signal transmission line 10*d* differs from the method for producing the high-frequency signal transmission line 10 in the step of performing pressure bonding on the dielectric element assembly 12. Accordingly, only the step of performing pressure bonding on the dielectric element assembly 12 will be described below, and any descriptions of the other steps will be omitted.

Dielectric sheets 18*d*, 18*a* to 18*c*, and 18*e* are stacked in this order, from the positive side to the negative side in the z-axis direction, as shown in FIG. 30, and then pressed and heated using crimping tools T11 and T12, as shown in FIG. 31. The crimping tools T11 and T12 will be described below.

The crimping tool T11 contacts the top surface of the dielectric sheet 18*d*, as shown in FIG. 31. The contact surface of the crimping tool T11 on the top surface of the dielectric sheet 18*d* is undulating. More specifically, the contact surface of the crimping tool T11 has protrusions P21 to P23 projecting toward the negative side in the z-axis direction and extending in the x-axis direction. The position of the protrusion P21 corresponds to a position in which a groove G21 is formed, the position of the protrusion P22 corresponds to a position in which a groove G22 is formed, and the position of the protrusion P23 corresponds to a position in which a groove G23 is formed. On the other hand, the crimping tool T12 contacts the bottom surface of the dielectric sheet 18*e*, as shown in FIG. 31. The contact surface of the crimping tool T12 on the bottom surface of the dielectric sheet 18*e* is undulating. More specifically, the contact surface of the crimping tool T12 includes protrusions P11 and P12 projecting toward the positive side in the z-axis direction and extending in the x-axis direction. The position of the protrusion P11 corresponds to a position in which a groove G11 is formed, and the position of the protrusion P12 corresponds to a position in which a groove G12 is formed. The crimping tools T11 and T12 as above include heaters. The crimping tools T11 and T12 heat and press the dielectric sheets 18*a* to 18*e*, thus softening the dielectric sheets 18*a* to 18*e*. As a result, the dielectric sheets 18*a* to 18*e* are bonded, the grooves G21 to G23 matching the shapes of the protrusions P21 to P23 are provided in the top surface of the dielectric sheet 18*d*, and the grooves G11 and G12 matching the shapes of the protrusions P11 and P12 are provided in the bottom surface of the dielectric sheet 18e, as shown in FIG. 31.

As with the high-frequency signal transmission line 10, the high-frequency signal transmission line 10d thus configured renders it possible to reduce spurious radiation. More specifically, the high-frequency signal transmission line 10d includes the undulating portion located on the bottom surface of the dielectric sheet 18e, so that some electromagnetic field radiation from inside the high-frequency signal transmission line 10d is diffusely reflected by the undulating portion back into the high-frequency signal transmission line 10d. As a result, the energy of the diffusely reflected electromagnetic field radiation is consumed by the reference ground conductor 22, the auxiliary ground conductor 24, or the dielectric element assembly 12. Thus, the high-frequency signal transmission line 10d renders it possible to reduce or prevent spurious radiation.

Furthermore, in the high-frequency signal transmission line 10d, the sections A11, A13, A15, A17, and A19 of the dielectric element assembly 12 are resistant to bending. More specifically, in the case of the high-frequency signal transmission line 10d, the crimping tool T11 with the protrusions P21 to P23 is used to pressure bond of the dielectric element assembly 12. At the time of pressure bonding, the protrusions P21 to P23 sink into the top surface of the dielectric sheet 18d. Since the crimping tool T11 includes the heater, the dielectric sheet 18d is heated, so that it is softened and fluidized. The dielectric material moves from the areas where the protrusions P21 to P23 sank into the dielectric sheet 18d to opposite sides of the protrusions P21 to P23 in the y-axis direction. Accordingly, the thickness of the dielectric element assembly 12 in the z-axis direction increases where the grooves G21 to G23 are not provided. As a result, the second moment of area for the dielectric element assembly 12 increases. The grooves G21 to G23 are provided so as to extend through the sections A11, A13, A15, A17, and A19. Accordingly, in the high-frequency signal transmission line 10d, the sections A11, A13, A15, A17, and A19 of the dielectric element assembly 12 are resistant to bending.

Note that the grooves G21 to G23 are interrupted in the sections A12, A14, A16, and A18 of the dielectric element assembly 12. Accordingly, the high-frequency signal transmission line 10d can be bent for use as shown in FIG. 9.

Fifth Modification

Figure 32:
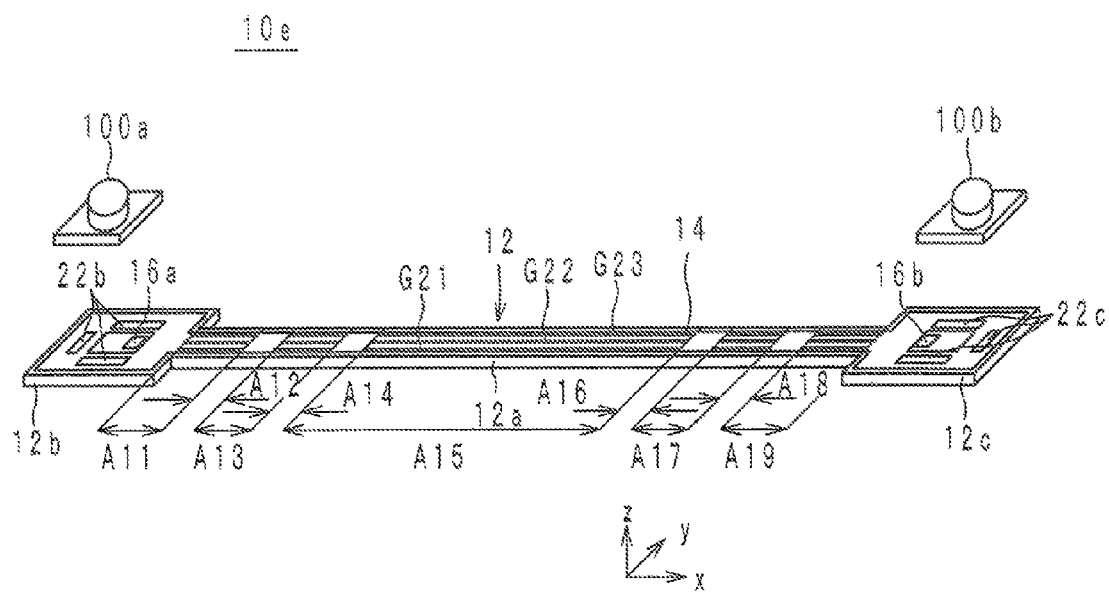
FIG. 32 is an external oblique view of a high-frequency signal transmission line according to a fifth modification of a preferred embodiment of the present invention.
Figure 33:
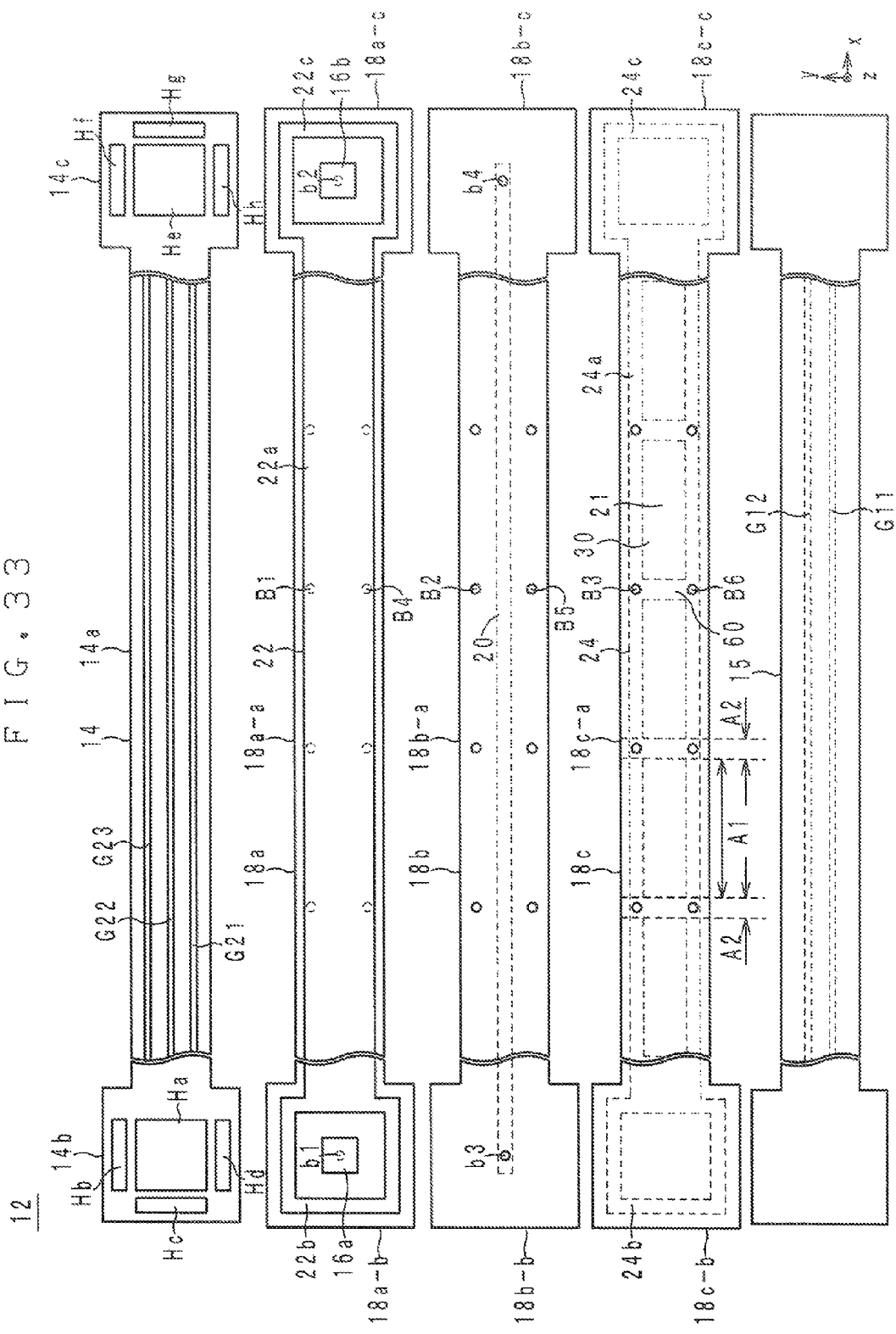
FIG. 33 is an exploded view of a dielectric element assembly of the high-frequency signal transmission line in FIG. 32.
Figure 34:
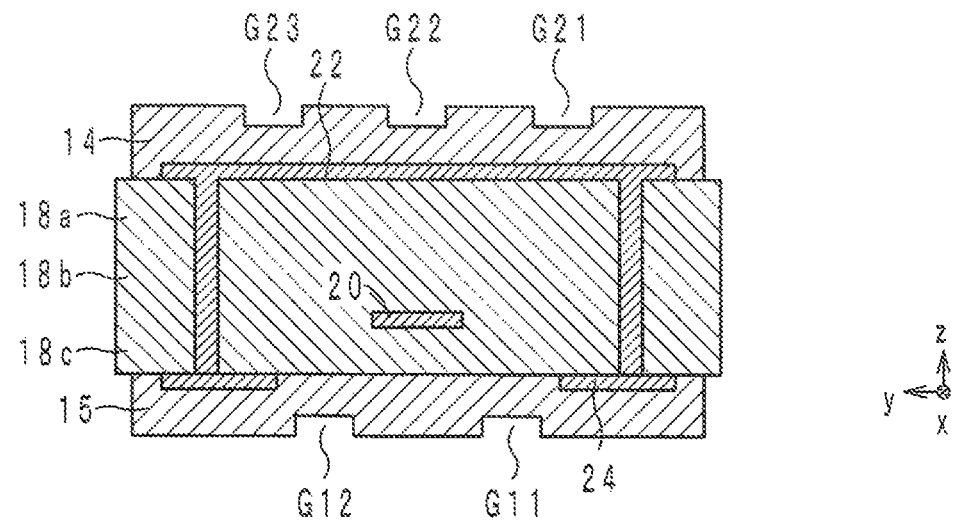
FIG. 34 is a cross-sectional structure view of the high-frequency signal transmission line as taken at a section A11, A13, A15, A17, or A19 in FIG. 32.
Figure 35:
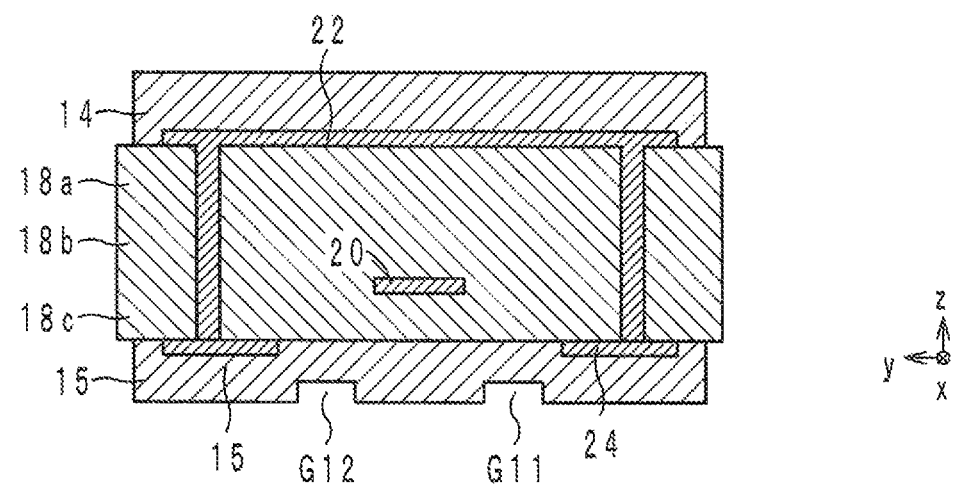
FIG. 35 is a cross-sectional structure view of the high-frequency signal transmission line as taken at a section A12, A14, A16, or A18 in FIG. 32.
Figure 3:
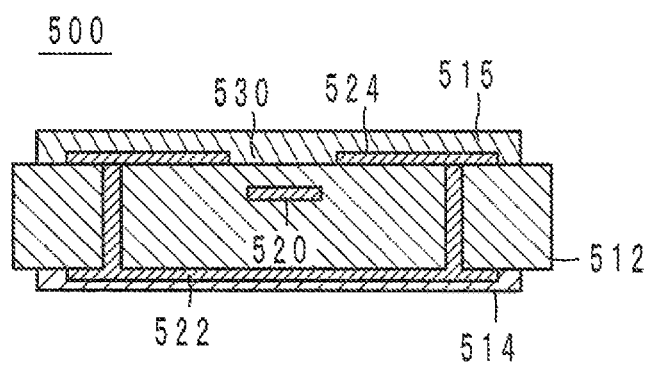

Hereinafter, the configuration of a high-frequency signal transmission line according to a fifth modification of a preferred embodiment of the present invention will be described with reference to the drawings. FIG. 32 is an external oblique view of the high-frequency signal transmission line 10e according to the fifth modification. FIG. 33 is an exploded view of a dielectric element assembly 12 of the high-frequency signal transmission line 10e in FIG. 32. FIG. 34 is a cross-sectional structure view of the high-frequency signal transmission line 10e as taken at a section A11, A13, A15, A17, or A19 in FIG. 32. FIG. 35 is a cross-sectional structure view of the high-frequency signal transmission line 10e as taken at a section A12, A14, A16, or A18 in FIG. 32.

The high-frequency signal transmission line 10e differs from the high-frequency signal transmission line 10d in that protective layers 14 and 15 are provided in place of the dielectric sheets 18d and 18e. The high-frequency signal transmission line 10e will be described below, focusing on the difference. Any features of the high-frequency signal transmission line 10e that are the same as those of the high-frequency signal transmission line 10d will be denoted by the same reference characters.

The dielectric element assembly 12 of the high-frequency signal transmission line 10e is formed by laminating the protective layer 14, dielectric sheets 18a to 18c, and the protective layer 15 in this order, from the positive side to the negative side in the z-axis direction. The protective layers 14 and 15 of the high-frequency signal transmission line 10e are the same as those of the high-frequency signal transmission line 10, and therefore, any descriptions thereof will be omitted.

The high-frequency signal transmission line 10e includes an undulating portion provided on the principal surface (the bottom surface) of the dielectric element assembly 12 that is located on the negative side in the z-axis direction, such that the undulating portion overlaps with openings 30 when viewed in a plan view in the z-axis direction, as shown in FIGS. 32 through 35. More specifically, the undulating portion is formed on the bottom surface of the protective layer 15 by providing grooves G11 and G12 in the bottom surface of the protective layer 15 so as to extend in the x-axis direction along the signal line 20. Since the bottom surface of the protective layer 15 is the bottom surface of the dielectric element assembly 12, the grooves G11 and G12 are positioned in the bottom surface of the dielectric element assembly 12.

The groove G11 is a portion of the bottom surface of the protective layer 15, which, when viewed in a plan view in the z-axis direction, is positioned on the negative side in the y-axis direction relative to the signal line 20 and recessed toward the positive side in the z-axis direction. The groove G12 is a portion of the bottom surface of the protective layer 15, which, when viewed in a plan view in the z-axis direction, is positioned on the positive side in the y-axis direction relative to the signal line 20 and recessed toward the positive side in the z-axis direction. The grooves G11 and G12, when viewed in a plan view in the z-axis direction, do not overlap with the signal line 20. That is, the grooves G11 and G12, when viewed in a plan view in the z-axis direction, are positioned on opposite sides of the signal line 20 in the y-axis direction (i.e., in the width direction of the signal line 20).

Furthermore, the high-frequency signal transmission line 10e includes an undulating portion provided on the principal surface (top surface) of the dielectric element assembly 12 that is located on the positive side in the z-axis direction when viewed in a plan view in the z-axis direction, as shown in FIGS. 32 through 35. More specifically, grooves G21 to G23 are provided in the principal surface (top surface) of the protective layer 14 that is located on the positive side in the z-axis direction, as shown in FIGS. 32 through 35. The top surface of the protective layer 14 is the top surface of the dielectric element assembly 12, and therefore, the grooves G11 and G12 are positioned in the top surface of the dielectric element assembly 12.

The groove G21 is a portion of the top surface of the protective layer 14, which, when viewed in a plan view in the z-axis direction, is positioned on the negative side in the y-axis direction relative to the signal line 20 and recessed toward the negative side in the z-axis direction. The groove G22 is a portion of the top surface of the protective layer 14, which, when viewed in a plan view in the z-axis direction, overlaps with the signal line 20 and is recessed toward the negative side in the z-axis direction. The groove G23 is a portion of the top surface of the protective layer 14, which, when viewed in a plan view in the z-axis direction, is positioned on the positive side in the y-axis direction relative to the signal line 20 and recessed toward the negative side in the z-axis direction.

Furthermore, the grooves G21 to G23 extend through the sections A11, A13, A15, A17, and A19 but are interrupted by the sections A12, A14, A16, and A18 intervening therebetween, as shown in FIG. 32. Accordingly, the sections A11, A13, A15, A17, and A19 of the dielectric element assembly 12 are more resistant to bending than the sections A12, A14, A16, and A18 of the dielectric element assembly 12. Other features of the high-frequency signal transmission line 10e are the same as those of the high-frequency signal transmission line 10d, and therefore, any descriptions thereof will be omitted.

As with the high-frequency signal transmission line 10d, the high-frequency signal transmission line 10e thus configured renders it possible to reduce spurious radiation.

Furthermore, in the high-frequency signal transmission line 10e, as in the high-frequency signal transmission line 10d, the sections A11, A13, A15, A17, and A19 of the dielectric element assembly 12 are resistant to bending. In addition, the grooves G21 to G23 are interrupted in the sections A12, A14, A16, and A18 of the dielectric element assembly 12. Accordingly, the high-frequency signal transmission line 10e can be bent for use as shown in FIG. 9.

Sixth Modification

Hereinafter, the configuration of a high-frequency signal transmission line according to a sixth modification of a preferred embodiment of the present invention will be described with reference to the drawings. FIG. 36 is a cross-sectional structure view of the high-frequency signal transmission line 10f according to the sixth modification. For the external oblique view of the high-frequency signal transmission line 10f, FIG. 1 will be referenced.

The high-frequency signal transmission line 10f differs from the high-frequency signal transmission line 10e in that the grooves G21 to G23 are not provided. As in the case of the high-frequency signal transmission line 10f, when no sections need to be resistant to bending, the grooves G21 to G23 are dispensable.

Other Preferred Embodiments

The present invention is not limited to the high-frequency signal transmission lines 10 and 10a to 10f according to the above preferred embodiments and modifications thereof, and variations can be made within the spirit and scope of the present invention.

Furthermore, the configurations of the high-frequency signal transmission lines 10 and 10a to 10f and some steps of their production methods may be used in combination.

The protective layers 14 and 15 have been described above as being formed preferably by screen printing, but they may be formed by photolithography, for example.

The high-frequency signal transmission lines 10 and 10a to 10f do not necessarily have the connectors 100a and 100b mounted thereon. In such a case, the high-frequency signal transmission lines 10 and 10a to 10f are connected at their ends to circuit boards by soldering. Note that each of the high-frequency signal transmission lines 10 and 10a to 10f may have only the connector 100a mounted on one end.

Further, the high-frequency signal transmission lines 10 and 10a to 10f have been described above as having the connectors 100a and 100b mounted on their top surfaces, but the connectors 100a and 100b may be mounted on the bottom surfaces of the high-frequency signal transmission lines 10 and 10a to 10f. Alternatively, the connectors 100a and 100b may be mounted on the top and bottom surfaces, respectively, of the high-frequency signal transmission lines 10 and 10a to 10f.

Still further, the high-frequency signal transmission lines 10 and 10a to 10f do not have to be provided with the reference ground conductor 22.

Yet further, the auxiliary ground conductor 24 may be provided on the top surface of the dielectric sheet 18b.

Yet further, the high-frequency signal transmission lines 10 and 10a to 10f preferably have the grooves G1 and G2, the grooves G1 to G4, or the grooves G11 and G12 provided in the bottom surface of the dielectric sheet 18c or 18e or the protective layer 15, such that the undulating portion is provided on the bottom surface of the dielectric sheet 18c or 18e or the protective layer 15, so as to overlap with the openings 30 when viewed in a plan view in the z-axis direction. However, this does not limit the method for providing the undulating portion on the bottom surface of the dielectric sheet 18c so as to overlap with the openings 30 when viewed in a plan view in the z-axis direction. The grooves G1 and G2 may extend in the y-axis direction or in a direction oblique to the x-axis or y-axis direction. Moreover, a plurality of grooves may be provided so as to extend in two directions and define a mesh-shaped pattern. Furthermore, the undulating portion may be provided by forming a plurality of dot-like depressions in place of grooves, for example.

Yet further, the high-frequency signal transmission lines 10 and 10a to 10f may preferably be used on RF circuit boards such as antenna front end modules.

Yet further, the grooves G1 to G4, G11, and G12 of the high-frequency signal transmission lines 10, 10a to 10d, and 10f may be formed by scratching the bottom surface of the dielectric sheet 18c or 18e after pressure bonding of the dielectric sheets 18a to 18c (or the dielectric sheets 18a to 18e). Similarly, the grooves G11 and G12 of the high-frequency signal transmission line 10e may be formed by scratching the bottom surface of the protective layer 15.

Yet further, the specific permittivity $\in 2$ of each of the protective layers 14 and 15 does not have to be higher than the specific permittivity $\in 1$ of each of the dielectric sheets 18a to 18c (or the dielectric sheets 18a to 18e).

Yet further, the grooves G1 and G2 or the grooves G11 and G12 of the high-frequency signal transmission lines 10 and 10b to 10f are preferably provided on the opposite sides of the signal line 20 in the y-axis direction, but they may be provided on one side of the signal line 20 in the y-axis direction.

Yet further, as with the high-frequency signal transmission line 10, the high-frequency signal transmission lines 10a to 10f can be used in electronic devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency signal transmission line, comprising:
a dielectric element assembly including a plurality of dielectric layers laminated on each other in a lamination direction, the plurality of dielectric layers having substantially the same dielectric constant;

a linear signal line provided at the dielectric element assembly; and a first ground conductor provided on a first side in the lamination direction relative to the signal line and including a plurality of openings arranged along the signal line; wherein one of the plurality of dielectric layers that is positioned at an end of the first side in the lamination direction includes an undulating portion provided on a first surface located on the first side in the lamination direction, such that the undulating portion overlaps with the openings when viewed in a plan view in the lamination direction;

the undulating portion is defined by grooves provided in the dielectric layer at the end of the first side in the lamination direction, the grooves extending along the signal line in the first surface;

the first ground conductor has a ladder-shaped configuration with bridge portions provided between the openings being adjacent to one another; and the grooves overlap with the bridge portions when viewed in a plan view in the lamination direction.

2. The high-frequency signal transmission line according to claim 1, wherein the grooves, when viewed in a plan view in the lamination direction, are provided on one or both sides of the signal line in a width direction of the signal line.

3. The high-frequency signal transmission line according to claim 1, wherein the dielectric element assembly includes a resist layer provided on the first surface of the dielectric layer positioned at the end of the first side in the lamination direction, the resist layer having a higher specific permittivity than the dielectric layer.

4. The high-frequency signal transmission line according to claim 1, wherein another undulating portion is provided on a second surface of the dielectric layer positioned at an end of the second side in the lamination direction.

5. An electronic device, comprising:
the high-frequency signal transmission line according to claim 1; and
a housing accommodating the high-frequency signal transmission line.

6. A high-frequency signal transmission line, comprising:
a dielectric element assembly including a plurality of dielectric layers laminated on each other in a lamination direction, the plurality of dielectric layers having substantially the same dielectric constant;
a linear signal line provided at the dielectric element assembly;
a first ground conductor provided on a first side in the lamination direction relative to the signal line and including a plurality of openings arranged along the signal line; and
a second ground conductor provided on a second side in the lamination direction relative to the signal line; wherein
one of the plurality of dielectric layers that is positioned at an end of the first side in the lamination direction includes an undulating portion provided on a first surface located on the first side in the lamination direction, such that the undulating portion overlaps with the openings when viewed in a plan view in the lamination direction;
the first ground conductor is less distant from the signal line in the lamination direction than the second ground conductor from the signal line in the lamination direction;

the first ground conductor has a ladder-shaped configuration with bridge portions provided between the openings adjacent to one another; and a distance between an overlap of the signal line with the bridge portion and the second ground conductor in the lamination direction is smaller than a distance between an overlap of the signal line with the opening and the second ground conductor in the lamination direction.

7. The high-frequency signal transmission line according to claim 6, wherein the overlap of the signal line with the opening is wider than the overlap of the signal line with the bridge portions.

8. The high-frequency signal transmission line according to claim 6, wherein the dielectric element assembly includes a resist layer provided on the first surface of the dielectric layer positioned at the end of the first side in the lamination direction, the resist layer having a higher specific permittivity than the dielectric layer.

9. The high-frequency signal transmission line according to claim 6, wherein another undulating portion is provided on a second surface of the dielectric layer positioned at an end of the second side in the lamination direction.

10. An electronic device, comprising:
the high-frequency signal transmission line according to claim 6; and
a housing accommodating the high-frequency signal transmission line.

11. A high-frequency signal transmission line, comprising:
a dielectric element assembly including a plurality of dielectric layers laminated on each other in a lamination direction;
a linear signal line provided in the dielectric element assembly; and
a first ground conductor provided on a first side in the lamination direction relative to the signal line and including a plurality of openings arranged along the signal line; wherein
the dielectric element assembly includes an undulating portion provided on a first surface located on the first side in the lamination direction so as to overlap with the openings when viewed in a plan view in the lamination direction;
the undulating portion is defined by grooves provided in the dielectric element assembly in the lamination direction, the grooves extending along the signal line in the first surface;
the first ground conductor has a ladder-shaped configuration with bridge portions provided between the openings being adjacent to one another; and
the grooves overlap with the bridge portions when viewed in a plan view in the lamination direction.

12. The high-frequency signal transmission line according to claim 11, wherein the grooves, when viewed in a plan view in the lamination direction, are provided on one or both sides of the signal line in a width direction of the signal line.

13. The high-frequency signal transmission line according to claim 11, wherein the dielectric element assembly includes a resist layer provided on the first surface of the dielectric element assembly in the lamination direction, the resist layer having a higher specific permittivity than the dielectric element assembly.

14. The high-frequency signal transmission line according to claim 11, wherein another undulating portion is provided on a second surface of the dielectric element assembly positioned at an end of the second side in the lamination direction.

15. An electronic device, comprising:
- the high-frequency signal transmission line according to claim 11; and
- a housing accommodating the high-frequency signal transmission line.

16. A high-frequency signal transmission line, comprising:
- a dielectric element assembly including a plurality of dielectric layers laminated on each other in a lamination direction;
- a linear signal line provided in the dielectric element assembly;
- a first ground conductor provided on a first side in the lamination direction relative to the signal line and including a plurality of openings arranged along the signal line; and
- a second ground conductor provided on a second side in the lamination direction relative to the signal line; wherein
- the dielectric element assembly includes an undulating portion provided on a first surface located on the first side in the lamination direction so as to overlap with the openings when viewed in a plan view in the lamination direction;
- a distance between the first ground conductor and the signal line in the lamination direction is smaller than a distance between the second ground conductor and the signal line in the lamination direction;
- the first ground conductor has a ladder-shaped configuration with bridge portions provided between the openings adjacent to one another; and
- a distance between an overlap of the signal line with the bridge portion and the second ground conductor in the lamination direction is smaller than a distance between an overlap of the signal line with the opening and the second ground conductor in the lamination direction.

17. The high-frequency signal transmission line according to claim 16, wherein the overlap of the signal line with the opening is wider than the overlap of the signal line with the bridge portions.

18. The high-frequency signal transmission line according to claim 16, wherein the dielectric element assembly includes a resist layer provided on the first surface of the dielectric element assembly in the lamination direction, the resist layer having a higher specific permittivity than the dielectric element assembly.

19. The high-frequency signal transmission line according to claim 16, wherein another undulating portion is provided on a second surface of the dielectric element assembly positioned at an end of the second side in the lamination direction.

20. An electronic device, comprising:
- the high-frequency signal transmission line according to claim 16; and
- a housing accommodating the high-frequency signal transmission line.

* * * * *